(12) United States Patent
Garnache et al.

(10) Patent No.: US 6,611,546 B1
(45) Date of Patent: Aug. 26, 2003

(54) OPTICAL TRANSMITTER COMPRISING A STEPWISE TUNABLE LASER

(75) Inventors: Arnaud Garnache, Montpillier cedex (FR); Daniele Romanini, Grenoble (FR); Frederic Stoeckel, Vaulnaveys le Haut (FR); Alexandre Katchanov, Sunnyvale, CA (US); Guido Knippels, Sunnyvale, CA (US); Barbara Paldus, Sunnyvale, CA (US); Christopher Rella, Sunnyvale, CA (US); Bruce Richman, Sunnyvale, CA (US); Marc Levenson, Campbell, CA (US)

(73) Assignee: BlueLeaf, Inc., Sunnyvale, CA (US)

( * ) Notice: Subject to any disclaimer, the term of this patent is extended or adjusted under 35 U.S.C. 154(b) by 0 days.

(21) Appl. No.: 09/930,841

(22) Filed: Aug. 15, 2001

(51) Int. Cl.$^7$ ................................................. H01S 3/08
(52) U.S. Cl. ........................................................ 372/92
(58) Field of Search ............................ 372/92, 35, 103, 372/20, 99; 359/845

(56) References Cited

U.S. PATENT DOCUMENTS

| | | | | | |
|---|---|---|---|---|---|
| 4,202,605 | A | * | 5/1980 | Heinz | 359/845 |
| 4,287,486 | A | * | 9/1981 | Javan | 372/20 |
| 5,138,628 | A | * | 8/1992 | Pocholle et al. | 372/99 |
| 5,583,882 | A | * | 12/1996 | Miyai et al. | 372/103 |
| 5,862,162 | A | * | 1/1999 | Maeda | 372/20 |
| 6,205,159 | B1 | * | 3/2001 | Sesko et al. | 372/20 |
| 6,339,605 | B1 | * | 1/2002 | Vetrovec | 372/35 |

* cited by examiner

Primary Examiner—Paul Ip
Assistant Examiner—Hung T Vy
(74) Attorney, Agent, or Firm—Herbert Buckard; John F. Schipper

(57) ABSTRACT

An optical fiber transmitter for emitting an information-carrying laser beam comprises an optically or electrically pumped single mode MQW (multi quantum well) semiconductor amplifying mirror as a gain medium and a separate external reflector to form a cavity. The external cavity length defines a comb of optical modes, all or a subset of which corresponding to channel wavelengths of an optical telecommunications system having plural optical channels. The semiconductor gain element has a homogeneously broadened gain region; a tuning arrangement tunes the laser from mode to mode across the gain region thereby selecting each one of the plural optical channels. When the maximum gain bandwidth is less than mode-to-mode spacing defined by the cavity, that tuning arrangement comprises a means of altering the temperature of the amplifying mirror, thereby translating the frequency of the gain peak from one mode to another. An optical modulator adds modulation to a beam emitting from the laser to provide the information-carrying laser beam, and a coupler couples the information-carrying laser beam into an optical fiber of the optical telecommunications system. A calibration method based on detecting inter-mode optical transitions (mode hopping) is described. The parameters of the amplifying mirror and tuning arrangement can be adjusted during operation to switch quickly from one cavity mode to another in stepwise fashion.

20 Claims, 8 Drawing Sheets

Stepwise-tunable vertical externaal cavity surface emitting laser

Stepwise-tunable vertical externaal cavity surface emitting laser

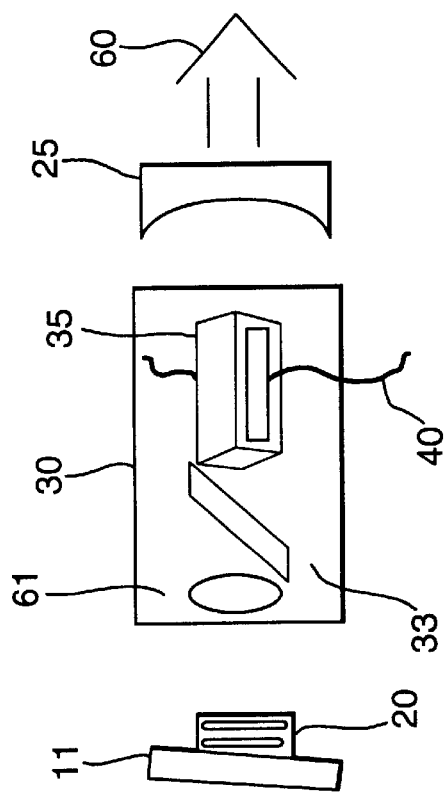
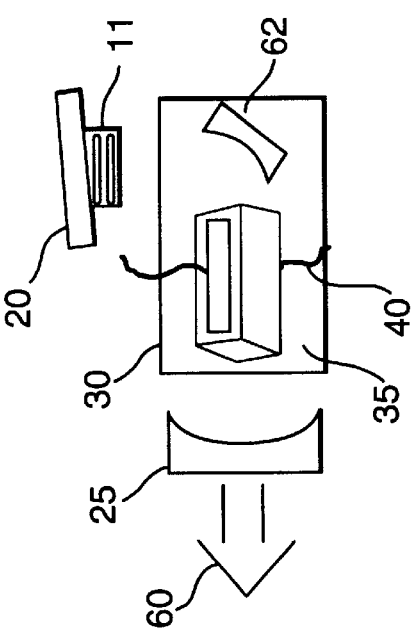
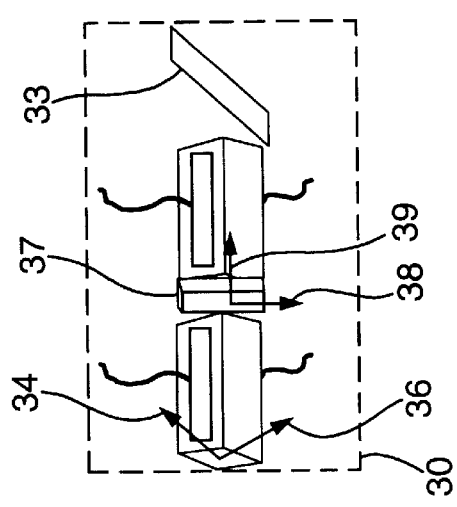
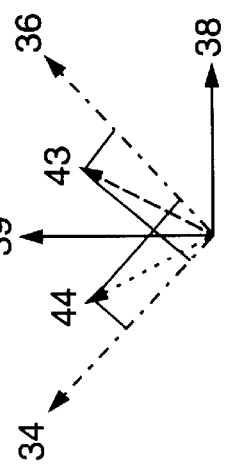

OPTICAL TRANSMITTER COMPRISING A STEPWISE TUNABLE LASER

FIELD OF THE INVENTION

The present invention relates to lasers emitting single longitudinal and traverse mode radiation at selected wavelengths defined by a frequency comb, in particular stepwise tunable external cavity surface emitting semiconductor lasers pumped optically or electronically for use in spectroscopy, process control and optical communications. Particularly laser designs, manufacturing and assembly processes for frequency stable and rapidly tunable lasers for optical communications.

BACKGROUND OF THE INVENTION

The use of lasers as part of a system for optical channel switching in a fiber optic transport network is known. However, existing systems utilize a multiplicity of individual lasers, each of which emits at a single frequency. A further problem is that current switching systems using single frequency lasers require extremely complex circuitry to transform a set of input signals to a set of output signals of different frequencies.

A significant enhancement of such laser based optical channel switching systems would be achieved by use of a laser having the following operating characteristics:

1) the laser is rapidly tunable to specific desired output frequencies, e.g. the frequencies of the ITU grid.
2) The laser provides random access to any particular output frequency (i.e. transmission channel).
3) The laser is reliable and consistent in the output frequency to which it is tunable over a long service life without requiring extensive servicing or a carefully controlled operating environment.
4) The laser is consistently receptive to an input signal since it must always tune to the correct output frequency (i.e. channel number).
5) The laser provides substantially uniform output power independent of the particular output frequency selected.

We have discovered a laser system which fulfills the above indicated performance requirements.

Typical lasers oscillate at a number of frequencies or wavelengths that correspond to modes of their optical cavities. In certain applications, it is known to select a single such mode and to adjust its frequency by varying the cavity length or some other laser parameter. Methods of doing this are described in text books such as A. Yariv, Quantum Electronics, John Wiley and Sons, New York, $2^{nd}$ edition, 1975 and M. D. Levenson and S. S. Kano, Introduction to Nonlinear Laser Spectroscopy Revised Edition, Academic Press, San Diego, 1988 and Demtroder, Laser Spectroscopy, Springer, Berlin, 1996.

However, the task of quickly switching the laser output frequency from one externally selected value to another externally selected frequency—without lasing at intermediate frequencies—poses significant technical difficulties. Known means of doing this alter some other significant laser parameter, such as output power, create an instability in the output frequency either before or after the frequency switch, and/or switch to an unwanted value which must then be homed-in on (actually adjusted to) the desired frequency, which requires time. In many optical communications and spectroscopy applications, delay in obtaining stable operation after a frequency switch is certainly undesirable and is frequently unacceptable.

Most semiconductor lasers generally follow two basic architectures. The first laser type has an in-plane cavity, and the second laser type has a vertical cavity, a so-called vertical-cavity surface-emitting laser or "VCSEL". If the optical resonance cavity is formed externally of the semiconductor structure (active region) i.e. one of the reflecting surfaces is physically separated from the active region, the laser is known as a vertical external cavity surface-emitting laser or "VECSEL". This acronym is also deemed to mean "vertical external (or extended) cavity stimulated emission laser. There is no difference in the actual laser structure.

Electrically pumped diode lasers are most frequently of the in-plane cavity type. Necessary optical feedback with the in-plane type is most frequently provided by simple cleaved-facet mirrors at each end of the optical cavity. The reflectance of such cleaved mirrors, while generally sufficient is not very high, and laser energy is thus emitted through the cleaved mirrors to the external ambient at opposed edges of the structure, giving rise to "edge-emitting" diode lasers. Such relatively simple structures are sometimes referred to as Fabry-Perot diode lasers. Epitaxial patterning of a grating pattern along a top surface of an edge-emitting diode laser can be provided to set a design wavelength, resulting in a so-called distributed feedback diode ("DFB") laser.

In-plane electrically pumped lasers, such as DFB lasers, are typically single mode, and are also typically tunable continuously across some wavelength band from near-infrared into the visible light spectrum. Rapid tuning may be carried out by controlling the electrical pumping current, while slower tuning may be carried out by controlling the temperature of the laser via a heat sink and a thermal cooler/heater arrangement. Such in-plane lasers have known uses including optical wavelength absorption spectroscopy, storage, printing and telecommunications. In-plane lasers are frequently employed within telecommunications systems using optical fiber as the information transfer medium. Conventionally, multiple channels are carried through a single optical fiber, and it is therefore necessary when using a Fabry-Perot laser or DFB laser as the illuminating source to regulate the wavelength of the transmitting laser in order to stay on a selected channel.

In order to keep an in-plane diode laser tuned to a desired wavelength, current and thermal control loops must be provided to stabilize the laser at a desired wavelength, particularly as the laser ages during usage. Also, since there is no absolute wavelength stabilization within these in-plane lasers, the emission wavelength may drift, absent careful feedback control, during usage and over the lifetime of the laser. This tendency to drift or change emission characteristics with temperature and over time puts stringent conditions on the materials and control systems used to make the laser.

One known drawback of in-plane diode lasers, and most particularly the Fabry-Perot type, is that they manifest a tendency to mode-hop. Mode-hopping basically means that for a given pumping current, the laser can unexpectedly hop to a completely different mode (wavelength). As the current is increased, there are wavelengths at which the mode hopping (wavelength jumping) becomes uncontrollable. Moreover, diode lasers may manifest a hysteresis, in that mode hopping may occur at different wavelengths as the control current is increased as compared to when the control current is decreased. Another drawback of in-plane diode lasers is that output power is inextricably intertwined with active region temperature and pumping current. Another issue with in-plane diode lasers is that the transverse optical beam profile is typically elliptical rather than circular and has high divergence, increasing the complexity of coupling the laser energy into an optical fiber, or coupling the laser waveguide mode to an external cavity mode.

Dense wavelength division multiplexing (DWDM) for optical fiber telecommunications applications requires optical transmitters that can be tuned to any frequency in the standard ITU grid (wavelength comb) with a relative frequency error not greater than ten percent of the ITU channel spacing. This requirement implies that an optical transmitter laser has excellent frequency stability as well as broad tunability. For a 12.5 GHz channel spacing, the transmitter must have 1.25 GHz of absolute accuracy and frequency (wavelength) stability. Such control of the lasing frequency cannot be achieved with existing DFB lasers without complex electronic control and frequently carried out diagnostics. Furthermore, compensation algorithms must be developed in the laser control system to handle the DFB's known aging processes, which is often unpredictable.

A desirable characteristic of an ideal DWDM optical transmitter is that a single laser can cover all of the DWDM channels, and that it can be reliably and reproducibly set to any desired one of the standard channel frequencies. Current laser sources have only a limited tuning range, which covers only a fraction of the full ITU grid. Known DFB lasers have limited tunability; and the temperature tuning coefficient of telecom DFB lasers is typically 0.09 nm/° C. For a DFB laser thermal operating range of ±20° C., or 40° C. total temperature differential, one DFB laser could only be expected to cover a wavelength range of 3.6 nm (or about 460 GHz, representing only four channel coverage with 100 GHz channel spacing or 36 channel coverage with 25 GHz spacing) even if the necessary accuracy in wavelength could be achieved.

In addition, DFB lasers only have about 35 to 45 dB of side mode suppression. If the side modes are not sufficiently controlled, the laser may excite two or three adjacent communications channels, resulting in unwanted interference. Because of these drawbacks, the telecommunications industry has recently turned to VCSELs.

Micro-cavity VCSELs include semiconductor structures which have multiple layers epitaxially grown upon a semiconductor wafer/substrate, typically Gallium Arsenide or Indium Phosphide. The layers comprise semiconductor or dielectric Bragg mirrors which sandwich layers comprising quantum well active regions. Within the VCSEL photons emitted by the quantum wells bounce between the mirrors and then are emitted vertically from the wafer surface. The VCSEL type laser naturally has a circular dot geometry with lateral dimensions of a few microns. The emitting aperture of a few microns facilitates direct-coupling to optical fibers or other simple optics, since the narrow aperture typically supports only a single lateral mode ($TEM_{00}$) of the resulting optical waveguide, but is sufficiently wide to provide an emerging optical beam with a relatively small diffraction angle. A 1.3 micron VCSEL is said to have been developed by Sandia National Laboratories in conjunction with Cielo Communications, Inc. According to a news report, "This new VCSEL is made mostly from stacks of layers of semiconductor materials common in shorter wavelength lasers—aluminum gallium arsenide and gallium arsenide. The Sandia team added to this structure a small amount of a new material, indium gallium arsenide nitride (InGaAsN), which was initially developed by Hitachi of Japan in the mid 1990s. The InGaAsN causes the VCSEL's operating wavelength to fall into a range that makes it useable in high-speed Internet connections." ("'First ever' 1.3 micron VCSEL on GaAs", Optics.Org Industry News, posted Jun. 16, 2000).

One of the characteristics of micro-cavity VCSELs is that the laser cavity is formed entirely within the semiconductor structure. A drawback of such VCSELs is that they do not generate much power, on the order of 3 mW for a small aperture of 5 µm, for example. Also, there is transverse spatial hole burning between the transverse modes above about 3 mW.

As mentioned above, if a cavity is formed which is external to the VCSEL semiconductor structure having the quantum well active region, it is known as an external (extended) cavity laser (ECL). The semiconductor structures used in ECLs have been typically Fabry-Perot lasers having one facet antireflection coated so as not to interfere with external cavity operation. However, the gain medium can also be achieved using a SOA, (i.e. a semiconductor optical amplifier which is typically an edge-emitting semiconductor gain structure which however does not include the mirrors needed to convert it into a laser oscillator) or half of a VCSEL.

A semiconductor optical amplifier (SOA) is a device that amplifies an input signal of optical origin. The amplification factor is typically high (>20 dB). An SOA amplifies light as is propagates through a waveguide made of semiconductor material. An SOA is typically less than 1 mm in length. It amplifies light through stimulated emission Oust as a laser produces radiation). In essence, an SOA is a Fabry-Perot laser without feedback, having optical gain when the amplifier is pumped (optically or electrically) to create a population inversion leading to stimulated emission. The optical gain of wavelength and signal intensity depends on the SOA design and medium. However, an SOA can form the gain medium of a laser.

Typically an SOA has two AR (anti-reflection) coated facets. In some cases, the waveguide is defined by a ridge that has non-normal incidence to the facets to further reduce the effective facet reflectivity. The SOA design can lead to facet reflectivities that are 10 to 100 times smaller than in a Fabry-Perot laser. Were an SOA designed to have only one AR coated facet with non-normal incidence and normal incidence of the waveguide at the other facet, then it would form an active mirror. The non-normal incidence of the facet could either be cleaved (30% reflectivity) or HR (high reflectivity) coated. SOAs can also be designed to have a square waveguide structure which lends itslf to a circular Gausian beam.

In both VCSEL and SOA cases, one creates a so-called "active mirror" that defines one of the laser cavity reflectors but also provides the gain medium for the laser. The gain in this active mirror results from either electrical or optical excitation (pumping) of carriers that recombine in the quantum wells to create photons. The external cavity defines the coherence properties (wavelength) of these photons. If the gain medium is half a VCSEL, the external cavity version is referred to as a VECSEL. If the gain medium is an SOA the laser is called ECSAL. In general, we will refer to both such types of laser as a STECAM, a stepwise tunable, external cavity, active mirror laser.

A VECSEL based active mirror is an epitaxially grown semiconductor body, typically a few microns thick, which comprises a multiple quantum well active gain region sandwiched between a Bragg mirror grown on a semiconductor substrate and a capping layer. The active mirror may also have an antireflection coating that is either epitaxially grown or dielectrically deposited. An external cavity is then formed by a second, passive mirror that forms a stable resonator with the active mirror. Such an external cavity can either be a high reflectivity dielectric concave mirror or a plano/plano mirror with an intracavity refocusing element such as a lens. One example of an optically-pumped VECSEL is described in Published International Patent Application WO 00/10234, entitled "Optically-Pumped External-Mirror Vertical-Cavity Semiconductor-Laser", the disclosure thereof being incorporated herein by reference. The disclosed VECSEL includes an epitaxially-grown semiconductor structure or chip having a multiple-layer mirror structure integrated with a multiple-layer quantum-well structure which provides a gain medium, and an external mirror forming a resonant cavity with the integrated semiconductor multilayer mirror. Optical pumping radiation is directed at the quantum-well structure via an outermost (top layer) and is absorbed by the quantum-well and pump-absorbing layers. The quantum-well layers release photons in response to the pumping energy, and the external cavity is dimensioned to result in laser energy output at an approximate 976 nm wavelength in response to pumping energy at a wavelength of approximately 808 nm. Because this VECSEL operates at wavelengths below $1.1\mu$ in the near infra-red spectrum, the active gain medium is made to be aluminum-free, since aluminum ions tend to diffuse in GaAs materials-based lasers. Accordingly, the quantum-well and pump-radiation absorbing layers are aluminum-free layers of alloys of gallium arsenide and indium gallium arsenide phosphide (GaAs/InGaAsP). However, a drawback of the VECSEL described in this published International Patent Application is the absence of any wavelength tuning mechanism enabling adjustment of the laser emission wavelength.

Other VECSELs are described, inter alia, in a paper by Sandusky and Brueck, entitled: "A CW External-Cavity Surface-Emitting Laser", *IEEE Photonics Tech. Ltrs.*, Vol. 8, No. 3, March 1996, pp. 313–315; and, in a paper by Kuznetsov, Hamimi, Sprague, and Mooradian, entitled: "High Power (>0.5-W CW) Diode-Pumped Vertical-External-Cavity Surface-Emitting Semiconductor Lasers with Circular $TEM_{00}$ Beams", *IEEE Photonics Tech. Ltrs.*, Vol. 9, No. 8, August 1997, pp. 1063–1065.

Co-inventors Garnache and Kachanov of the present invention have previously reported in a note entitled "High-sensitivity intracavity laser absorption spectroscopy with vertical-external-cavity surface-emitting semiconductor lasers", *Optics Letters,* Vol. 24, No. 12, Jun. 15, 1999, pp. 826–828, that an optically pumped multiple-quantum-well ("MQW") VECSEL is an excellent candidate for use in high sensitivity intracavity laser absorption spectroscopy ("ICLAS"). In the ICLAS method an absorbent analyte is placed inside an external cavity of a broadband laser with homogeneously broadened gain. An L-shaped cavity was formed by the integrated Bragg mirror, an external folding mirror having a 150 mm radius of curvature, and a flat output coupler having 0.5 percent transmission placed at the end of a one meter arm of the cavity. The angle between the two arms was reduced to approximately 7 degrees to reduce astigmatism. A 500 mm long intra-cavity absorption cell with Brewster-angle windows and containing an analyte material was placed in the long arm. Generation time was controlled by an optical chopper that interrupts or starts the pump radiation beam and by an acousto-optic modulator that is triggered after an adjustable generation delay time. Further work by these authors with VECSELs in the field of spectroscopy is reported in a paper by Garnache, Kachanov, Stoeckel and Houdre entitled: "Diode-Pumped Broadband Vertical-External-Cavity Surface-Emitting Semiconductor Laser: Application to High Sensitivity Intracavity Laser Absorption Spectroscopy", *JOSA-B-B,* Vol. 17, No. 9, September 2000, pp. 1589–1598. The disclosures of these two articles are incorporated herein in their respective entireties by this reference thereto.

An intra-cavity etalon and a Lyot filter were said by Holm et al. to stabilize VECSEL radiation at a single wavelength in "Actively Stabilized Single-Frequency Vertical-External-Cavity AlGaAs Laser", *IEEE Photonics Technology Letters,* Vol. 11, No. 12, December 1999.

One approach for tuning a VECSEL is described in a note by D. Vakhshoori, P. Tayebati, Chih-Cheng Lu, M. Azimi, P. Wang, Jiang-Huai Zhou and E. Canoglu entitled, "2 mW CW single mode operation of a tunable 1550 nm vertical cavity surface emitting laser with 50 nm tuning range", published in *Electronics Letters,* Vol. 35, No. 11, May 27, 1999, pp. 900–901, the disclosure thereof being incorporated herein by reference. The described laser was grown epitaxially upon an indium phosphide substrate and has a cavity formed by a distributed Bragg reflector (DBR), a multiple quantum well (MQW) active gain region, and an external dielectric membrane mirror at a relatively short (~$7\mu$) distance from the active gain region. Because the VECSEL laser cavity is so short, only one cavity mode can fit into the bandwidth of the MQW gain structure. Cavity length can be changed by applying a potential difference between the dielectric membrane and the ambient supporting structure, thereby applying an electrostatic force to the membrane mirror and causing its curvature (and hence the cavity length) to change. Changing the cavity length shifts the cavity resonance frequency which thereby results in laser frequency tuning. The VECSEL is optically pumped by a 980 nm diode laser which can be epitaxially grown below the DWDM laser. The authors and an associated company, Coretek, have reported continuous tuning of this VECSEL over a range of about 50 nm, which is more than 10 times the tuning range of a typical DFB laser. This Coretek VECSEL is said to have a high quality $TEM_{00}$ transverse mode and more than 50 dB of side mode suppression.

However, the Coretek VECSEL does not appear to meet the DWDM telecom requirements. The micro-machined membrane mirror must be flexible in order to move the required tuning distance, and is therefore necessarily sensitive to external perturbations or vibrations and also can become self-excited into undesirable vibrational modes by actuation. This system is also complex to produce, with the evident difficulties of a multilayer epitaxial structure being compounded by the need to form, align and attach a precision micro-machined membrane external mirror. Thus, Coretek type VECSELs would be challenging to manufacture at a reasonable cost and yield in mass production. Furthermore, a complex feedback control system would be required to maintain membrane mirror position, thereby limiting absolute frequency set point stability and reproducibility in laser tuning.

Caprara et. al. (e.g. U.S. Pat. Nos. 5,991,318; 6,097,742 and 6,167,068) have described a very large, high-power VECSEL with intra-cavity harmonic generation crystals producing output radiation at 488 nm, (well below current telecommunication wavelengths). Since such a harmonic generation crystal creates loss for the laser mode being converted to a shorter wavelength, an additional intra-cavity wavelength control element is described. The fixed element described is a Brewster-angle birefringent plate. Such a tuning element requires mechanical rotation for adjustment and thus cannot provide rapid tuning. Moreover, mechanical adjustment causes energy to build up in the successive modes traversed by the filter transmission maximum.

Telle and Tang (Applied Physics Letters 24, 85–87 (1974) have described an electro-optic frequency selective filter for dye lasers that might be capable of rapid tuning if sufficiently high voltage can be sufficiently rapidly applied. However, the multi-kilovolt potentials required by that filter are too high for practical telecommunication use, and the beam collimation required is not compatible with VECSEL type lasers. Other previously known tunable filter technologies have too much loss for use with surface emitting semiconductor gain media and/or transmit extra unacceptable frequencies. However, when used in conjunction with a higher gain medium such as an SOA, these filters (e.g. liquid crystals) can provide a suitable lower voltage tuning alternative.

From the foregoing description of the state of the art, it is apparent that a hitherto unsolved need has remained for a simplified, reproducible and widely tunable single mode MQW VECSEL or SOA based laser for optical fiber telecommunications which overcomes the limitations and drawbacks of the prior art approaches. Especially, there remains a need for a compact near infra-red laser system capable of switching quickly (<10 µs) among cavity modes spaced at ~25–50 GHz from one another without producing unwanted frequencies.

OBJECTS OF THE INVENTION

One object of the present invention is to realize an optical fiber transmitter module including a single mode MQW VECSEL having a semiconductor structure with a homogeneously broadened active gain region and an external mirror spaced from the semiconductor structure by a spacer such that a cavity length is in a range of 0.5 mm and 50 mm and is chosen to create a laser frequency comb corresponding to a predetermined optical channel spacing arrangement.

Another object of the present invention is to realize a MQW VECSEL semiconductor structure formed by molecular beam epitaxy or metal oxide chemical vapor deposition in a manner enabling removal of the semiconductor substrate, thereby overcoming limitations and drawbacks of prior approaches in which the substrate contributed to the presence of a Fabry-Perot etalon or other unwanted optical element.

Another object is to realize an optical fiber transmitter module including a SOA with homogeneously broadened and unpolarized active gain and an external mirror.

Yet another object of the present invention is to realize a laser with reproducible absolute emission wavelengths that correspond to standardized wavelength division multiplex (WDM) channel wavelengths, as used in optical fiber telecommunications networks, such that the laser steps from channel to channel and such that by design the emission wavelengths of this laser are ensured to hit any desired channel wavelength accurately and have channel separation with an accuracy better than ten percent of channel spacing.

One more object of the present invention is to realize a fiber optic transmitter having sidemode suppression in excess of 40 dB.

One further object of the present invention is to provide a VECSEL or ECSAL for use as a laser source within a wide variety of applications and environments including telecommunications test equipment.

Another object of the present invention is to provide a compact VECSEL or ECSAL device with axial cavity modes (i.e. axial mode frequencies) which correspond to pre-determined communications or spectroscopic channels, and which is capable of randomly switching among such channels in 1 millisecond or less.

Another object of the invention is to provide a ECSAL to access the entire C or L optical communications band with a single laser device.

Another object of invention is to provide a method to access the entire C or L optical communications band with a single laser device.

Another object of this invention is to provide a frequency agile laser module meeting all current requirements for DWDM optical fiber communications.

An object of the present invention is to provide an external cavity type laser having a fixed cavity length selected so that permitted lasing modes match desired emission frequencies (e.g. the frequencies of the ITU grid).

One further object of the present invention is to realize a compact multi-quantum well (MQW) based optical transmitter with cavity modes which correspond to predetermined communications or spectroscopic channels.

Another object of the invention is to realize an optical transmitter that emits a stable $TEM_{00}$ beam at the frequency of a specific channel and which can be switched to another such channel by changing some convenient control parameter.

Another object of the invention is to provide an optical transmitter that is capable of randomly switching among such channels in 0.1 millisecond or less.

A preferred laser includes an intra-cavity, fast electro-optic tuning element providing minimum optical loss only at selected frequencies.

A preferred laser also includes a gain medium that is homogeneously broadened, coupled to a circular (Gaussian) external laser mode.

An optical fiber transmitter comprises an active mirror for emitting an information-carrying laser beam at a design wavelength and has an external cavity length defining a plurality of optical modes, each mode corresponding to a channel wavelength of an optical telecommunications system having plural optical channels. The active mirror (the mirror which is part of the gain medium) such as the semiconductor structure of an optical-pump-excited VECSEL or an SOA, has a homogeneously broadened multiple quantum well (MQW) active region wherein the gain curve exceeds cavity losses over a band which is less than mode-to-mode spacing, the gain region being tunable to step from a first mode to an adjacent second mode and to remain stably at the adjacent second mode. A tuning arrangement tunes the laser from mode to mode thereby to select each one of the plural optical channels. A conventional external optical amplitude modulator adds user traffic to a beam emitting from the laser to provide the information-carrying laser beam, and a coupler couples the traffic-carrying laser beam into an optical fiber of the optical telecommunications system. In the case of an SOA, the structure of the gain medium may lend itself to the integration of a modulator (e.g. electro absorptive or Mach-Zender)

The external cavity length is determined in accordance with the following parameters:
1) The frequency spacing of the ITU grid (or whole number fraction thereof) to be achieved.
2) The optical and/or temporal dispersion produced by intracavity optical elements.
3) The effective optical and/or temporal dispersion caused by the act of tuning.

In either a VECSEL or SOA based laser the external spherical mirror is positioned relative to the semiconductor structure by a spacer structure mounted to the heat sink at a distance in a range of 0.5 mm and 50 mm to form the external cavity and chosen to create a laser frequency comb corresponding to a predetermined optical channel spacing arrangement. Equivalently to the spherical mirror, a focusing intra cavity lens and plano plano mirror can be used to form the external cavity. The key to the external cavity design is that it be a stable resonator as defined in Siegmann "Lasers" University Science Books 1986 where the external cavity serves primarily as a feedback stabilization mechanism.

In accordance with some embodiments of the present invention, the VECSEL or ECSAL includes a heat sink structure and a semiconductor structure grown by molecular beam epitaxy upon a substrate and attached to the heat sink. As completed, the semiconductor structure comprises a multi-layer semiconductor or dielectric mirror region, a homogeneously broadened multiple quantum well gain region having a thickness equal to at least one design wavelength and having a plurality of quantum wells, each quantum well being optimally positioned with respect to a standing wave in the active gain region at the design wavelength, and an antireflection coating region having a low reflectance at the design wavelength. In the case of a MQW VECSEL the mirror can advantageously be a semiconductor Bragg reflector achieving at least 99% reflectance and the active region can be as short as one design wavelength. In the case of a SOA as the gain region, one mirror of the cavity can be a cleaved facet that may or may not have a dielectric coating and its active region can be hundreds of times the design wavelength, also in the case of an SOA, the active mirror is normally electrically pumped. However, careful consideration must be given to the waveguide design of the SOA to ensure that a good overlap between the external cavity mode and the fundamental waveguide mode is achieved and that higher order waveguide modes are not excited.

In the case of an optically pumped MQW VECSEL, an in-plane laser (e.g. Fabry Perot or DFB diode laser) providing pump radiation is aligned relative to an external surface of the semiconductor quantum well at Brewster's angle relative to the axis of pump laser emission. In this embodiment the diode laser pump is a sub-assembly which is aligned and secured in a sidewall of the spacer structure and is thereby made integral therewith. A pump radiation absorption element or aperture is preferably formed in the spacer structure at Brewster's angle opposite an angle of incidence of the pump radiation for absorbing any pump radiation residually reflected from the external surface of the active region. Note that by pumping the structure at Brewster's angle, over 90% of the pump radiation is typically absorbed. An optimized pumping arrangement can deliver as much as 99% of the pump radiation to the VECSEL structure. Brewster's angle is about 74 for InP based materials, which corresponds to a tan (74)=3:1 ratio for the incoming pump beam axes to produce a circular spot on the semiconductor. Because the geometry of most edge-emitting devices is 3:1, pumping at Brewster's angle eliminates the need to circularize the pump laser beam, reducing the complexity of the pump optics. In fact, only focusing optics such as one or two lenses are required to image the pump beam to the correct spot size on the active region. A simple $\lambda/2$ plate provides the correct polarization for incidence at Brewster's angle and hence maximum absorption. As is known to thosee skilled skilled in the art, the term Brewster's angle refers to the angle of incidence of light reflected from the surface of dielectric material at which the reflectivity for light whose electrical vector is in the plane of incidence becomes zero. This is sometimes referred to as the polarizing angle. In the context of the present invention where the dielectric material has a chemically composite multilayer structure and has in effect a composite refractive index, Brewster's angle (sometimes referred to as an angle analogous to Brewster's angle) is the angle corresponding to that composite refractive index. The size of the pump beam on the VECSEL is advantageously matched to the size of the external cavity transverse mode and account for thermal effects (such as thermal lensing) in the VECSEL itself.

A method for calibrating a stepwise tunable, external cavity amplifying mirror (STECAM) laser is also provided. The STECAM laser includes an external cavity formed by an external mirror at a length fixed by a spacer. The length defines a plurality of optical modes, each mode corresponding to a channel wavelength of an optical telecommunications system having plural optical channels. The semiconductor structure of the active mirror has a homogeneously broadened multiple quantum well (MQW) active region wherein the gain curve exceeds cavity losses over a band which is less than the mode-to-mode spacing, the laser output being tunable to step from a first mode to an adjacent second mode and to remain stably at the adjacent second mode. A tuning mechanism such as a thermoelectric cooler for cooling and heating the active gain region, or a frequency-selective element such as an intra-cavity etalon, is provided for tuning the STECAM laser from mode to mode. A digital controller including a wavelength-selective optical sensor responsive to laser output radiation tunes the laser from mode to mode and maintains the laser at each mode thereby to select each one of the plural optical channels. The wavelength-selective optical sensor generates pulses responsive to inter-mode optical transitions. The method includes steps of:

sweeping the tuning mechanism between a longest and a shortest wavelength mode capable of being generated by the laser in accordance with a control parameter generated by the digital controller, recording in the memory of the digital controller a transition control parameter presently being put out by the wavelength-selective optical sensing means upon detection of pulses responsive to inter-mode optical transitions, and determining and recording single mode set values as approximately half increment magnitudes between magnitudes of adjacent recorded transition control parameters.

Thus, the tuning mechanism precision required is reduced from having to land exactly on an ITU channel wavelength to simply creating a profile such that the laser snaps itself to the appropriate channel, whose wavelength has already been predetermined by the external cavity. Such a laser does not require expensive wavelength control circuitry.

These and other objects, advantages, aspects and features of the present invention will be more fully understood and appreciated by those skilled in the art upon consideration of the following detailed description of various embodiments, presented in conjunction with the accompanying drawings.

BRIEF DESCRIPTION OF THE DRAWINGS

The accompanying drawings, which constitute part of the specification, illustrate embodiments of the present invention, and together with the detailed description given below, serve to explain the invention.

In the Drawings:

The relationships of various elements and components are again illustrated schematically in FIGS. 11–22 in accordance with the current invention. In these drawings, like components are designated by like reference numbers.

FIG. 19 illustrates another embodiment of an electronically adjustable tuning element in which there are a plurality of electro-optically active birefringent media and additional birefringent media without electro-optical control.

FIG. 20 illustrates the polarization altering role of the birefringent, but non-electro-optically control media in the embodiment of the device shown in FIG. 9.

FIG. 21 illustrates another embodiment of an electronically tunable frequency selective element wherein it incorporates a lens to create a beam waist within the tuning device in addition to the beam waist present in the amplifying mirror.

FIG. 22 illustrates another embodiment of an electronically tunable frequency selective element wherein it incorporates an off-axis concave mirror to create a beam waist within the tuning device.

DETAILED DESCRIPTION OF THE INVENTION

Figure 1:
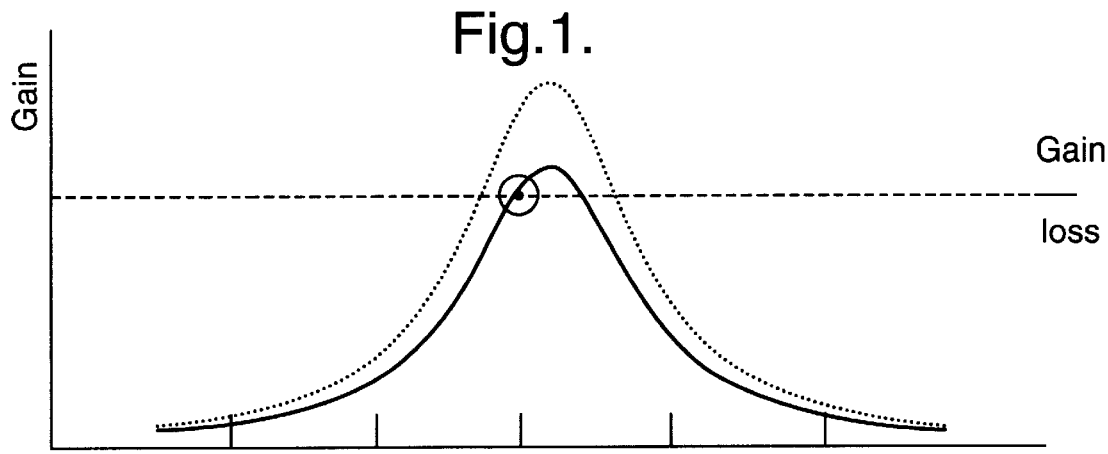
FIG. 1 is a pair of graphs of gain intensity as a function of VECSEL optical mode, showing an initial higher gain and a residual steady state lower gain suitable for exciting a single mode in continuous wave (CW) operation, rendering the VECSEL output single mode and useful for mode switching in optical fiber telecommunications.

The present invention provides a compact, tunable laser source which can be tuned over a range of several tens of nanometers within an optical telecommunications multichannel band plan and which will operate reliably and extendedly on selected ones of the multiple channels thereof (as specified by the International Telecommunications Union (ITU) DWDM grid plan, for example). The laser source is an active mirror (MQW VECSEL or SOA) having an epitaxially grown MQW gain structure with a reflector (e.g. an incorporated distributed Bragg reflector (DBR)) or a dielectric coating and an external dielectric coated spherical mirror. An intra cavity tuning element can be used to achieve rapid frequency selection. The external mirror is positioned to give an optical path length L from the MQW structure such that $c/2L=\Delta v_{DWDM}$, where c is the velocity of light and $\Delta v_{DWDM}$ is a required telecom optical channel spacing, such as 12.5 GHz or 25 GHz, for example. For a channel spacing of 25 GHz cavity length L should be approximately 0.6 cm. Note that $\lambda$ will typically include thickness and dispersion compensation for any intra cavity elements.

Separation between the MQW structure and the external mirror can be maintained by a spacer made of a material having a low index of thermal expansion, $\alpha$, such as fused silica ($\alpha \sim 10^{-6}$) or Zerodur™, a silica-like material made by Heraeus-Amersil and which can have a thermal expansion coefficient equal to essentially zero over a temperature range of several tens of degrees C. Alternatively, if the cavity components can be mounted on a miniature optical bench having a low (or controllable) index of thermal expansion, then a free space version of the laser is also possible. The resultant optical cavity provides a comb of fixed lasing frequencies.

An absolute frequency reproducibility $\Delta v/v = \Delta L/L = \alpha \Delta T$ of $6.3 \cdot 10^{-6}$ (for T=6° C.) can be realized with a fused silica spacer. In this laser, the external cavity itself serves as an absolute frequency standard (etalon). The spacer length tolerance $\delta L$ should be $L \cdot 6.3 \cdot 10^{-6} = 0.04\mu$, or 0.025 of the working wavelength. Such accuracy is well within the existing capability of the optical industry which can make retardation plates to adjust the accuracy of a polarization vector with better accuracy than one degree of retardation.

The radius of curvature of the external mirror is derived from the cavity mode diameter at the MQW structure for a cavity length equal to L. For example, with external mirror spacing L=0.6 cm a cavity mode diameter of 50$\mu$ will be achieved if the mirror radius of curvature is equal to 0.63 cm. Such mirrors can be manufactured by standard methods known in the optical industry, such as molding the mirrors against a diamond-turned metal preform. Note that in all laser designs, the cavity must be a stable resonator. This entails that other embodiments are also useable, such as plano/plano mirrors used in conjunction with an intra cavity lens.

In a preferred embodiment of the present invention, single frequency operation of the laser on a particular telecom channel is achieved: 1) by the homogeneous broadening properties of the MQW gain structure which results in a spectral narrowing of laser output radiation after the initial intensity buildup of laser radiation within the cavity, and 2) by laser cavity design in which the active gain structure is positioned so as to minimize spatial hole burning effects and favor single frequency operation, even if no additional frequency selection mechanisms (such as intra-cavity etalons or Lyot filters) are provided.

The transient behavior of a VECSEL made of InGaAs strained quantum wells having GaAs barriers has been studied and reported in the articles by co-inventors Garnache, et.al. cited in the Background of the Invention. For a VECSEL having a homogeneously broadened gain medium with gain bandwidth $\Gamma$ (half-width at half-maxium (HWHM)) and broadband mirrors, the intensity $M_q(t_g)$ of a mode q at a time $t_g$. (generation time) which is measured from the instant when pumping started can be described by the following equation (1):

$$M_q(t_g) = M \frac{\sqrt{\gamma t_g / \pi}}{2L\Gamma} \exp\left[-\left(\frac{q-q_0}{2L\Gamma}\right)^2 \gamma t_g\right], \quad (1)$$

where $q_0$ is a central mode number, and $\gamma$ is the cavity loss rate. Cavity loss rate $\gamma$ can be described by equation (2):

$$\gamma = -cln\lfloor R_{oc}(1-l_i)^2\rfloor/2L, \quad (2)$$

where c is the velocity of light, and the cavity has an output coupler having reflectivity $R_{oc}$, and internal loss $l_i$.

From equation (1) it follows that after a VECSEL starts lasing, its spectrum will be multimode with the total width close to the gain bandwidth $2\Gamma$, but the intensities of the side modes will decrease exponentially over time so that the spectral width $$\Delta v = \sqrt{\ln(2)/\gamma t_{jg}} \quad (3)$$

$\Delta v$(HWHM) will decrease in time inversely proportional to the generation time $t_g$, in accordance with equation (3):

It has been experimentally confirmed that a requirement for validity of equation (1) is that the gain medium of the active region of the VECSEL is homogeneously broadened and that any non-linear interactions between the modes are negligible for a given generation time. If, for a certain laser, the spectral width becomes smaller than cavity mode spacing, and equation (1) remains valid, the laser will collapse to single frequency operation. In the September 2000 JOSA-B paper of co-inventors Garnache, Kachanov and Romanini with co-author Houdre, it was shown that for a VECSEL active region comprising a strained InGaAs MQW in GaAs, this equation is valid at least for a generation time $t_g$ as large as one second. If one assumes a reasonable value of gain bandwidth $\Gamma$ as equal to 100 cm$^{-1}$ or 3000 GHz, external coupler reflectivity Roc=0.99 percent, and cavity internal loss $l_i$ of 0.001, then for a cavity length L of 0.6 cm, the spectrum must collapse to a bandwidth smaller than intermode spacing. equal to 25GHz at a time $t_g$~0.03 ms. This means that the VECSEL will then be lasing single frequency at a mode closest to the gain maximum. This time is significantly shorter than the time for which equation (1) was experimentally confirmed as reported in the above-referenced article. Note that for a higher gain active mirror such as an SOA, the cavity can support higher losses, such as 30% output coupling which corresponds to an even faster spectral collapse time of 3 $\mu$s. In principle, actual laser wavelength switching should occur in <1 $\mu$s.

Figure 2:
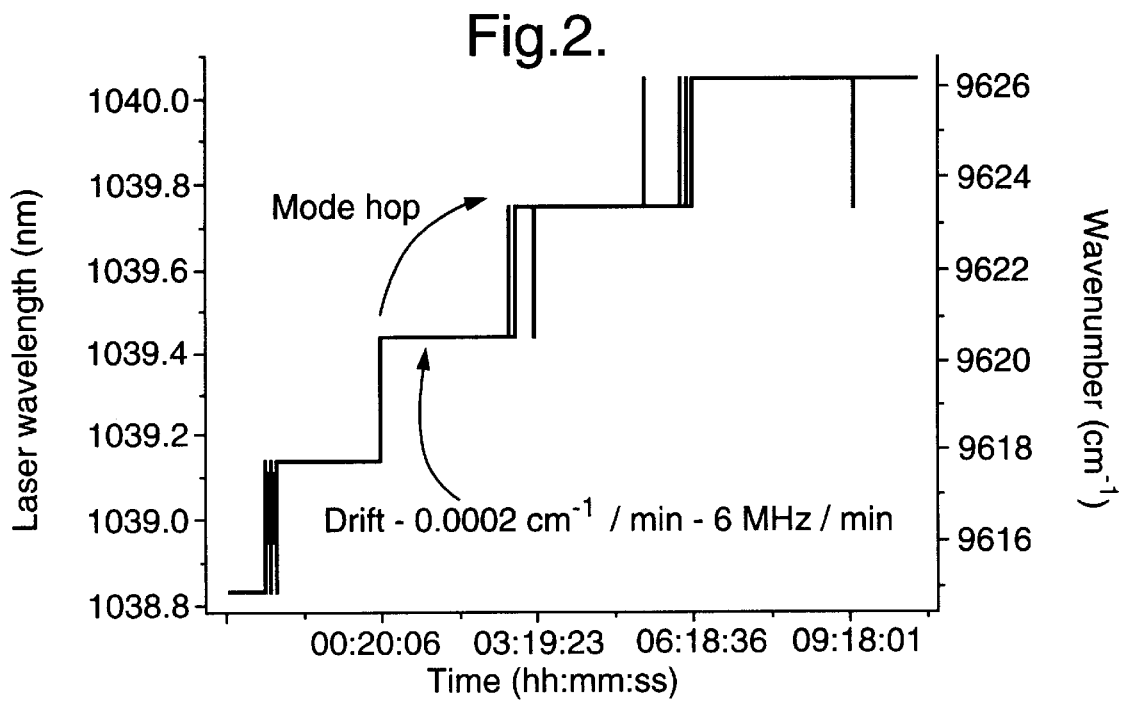
FIG. 2 shows thermally induced mode hopping over extended time intervals of a VECSEL useful for mode switching in optical fiber telecommunications.

FIG. 1 presents two plots of VECSEL active gain as a function of wavelength and pumping intensity, and marks a series of VECSEL cavity modes (resonances) across the abscissa of the graph. The dotted line shows initial intensity buildup in the cavity which takes place during the initial startup (and which is of particular interest and importance in the case of ICLAS). After about one microsecond the VECSEL active gain becomes clamped to the average cavity losses, and from the solid-line curve of FIG. 1 it is seen that only the mode closest to the gain maximum will be lasing, by adjusting pumping radiation to an appropriate level, and by thermally decoupling the VECSEL external cavity mirror, FIG. 2 shows that, following an initial mode-switch interval, it is practical, by thermal control, to relatively slowly move the VECSEL laser output radiation wavelength stably from mode to mode over time. Faster mode selection (<1 $\mu$s) may be achieved by providing a controllable intra-cavity element such as an etalon or Lyot filter.

Thermally controlled VECSEL mode hopping and stability at each selected mode (following startup phase) over an extended time period (hours) is shown in the FIG. 2 graph. This graph represents data obtained from a VECSEL having a semiconductor structure grown by molecular beam epitaxy on a 0.5 mm GaAs substrate. The bottom stack of the VECSEL is a standard Bragg mirror and consists of 30.5 pairs of AlAs-Al$_{0.27}$GaO$_{0.93}$As quarter-wave layers with a measured reflectance of 99.96 percent at a 1030 nm laser design wavelength. The active region (MQW) consists of two sets of three strained 8-nm In$_{0.2}$Ga$_{0.8}$As quantum wells separated by 10-nm GaAs barriers. Each set of quantum wells is placed at the maximum of the intracavity standing wave. 830-nm optical pump radiation is focused into the GaAs absorbing layers within the gain region (which has an optical thickness of 3$\lambda$/2. An AlAs quarter-wave layer followed by an Al$_{0.07}$Ga$_{0.23}$As half-wave layer was grown on top of the active region to prevent carriers from diffusing to the semiconductor surface and to have an Al-poor surface to avoid surface contamination. A Ti:sapphire pump laser emitted 830 nm pump radiation focused into the gallium arsenide absorbing layers within the gain region. The semiconductor chip was soldered onto a copper heat sink and cooled by a Peltier element and a heat radiator operably connected to a temperature controller. The optical pump source, the VECSEL structure and the external cavity mirror were mounted onto an aluminum base plate. Tunability was achieved over a range of 1012 to 1086 nm with less than 500 mW of pump power. Further information concerning this particular VECSEL can be found in the paper entitled: "High-sensitivity intracavity laser absorption spectroscopy with vertical-external-cavity surface-emitting semiconductor lasers", by co-inventors Garnache, Kachanov, Stoeckel, and co-author Planel, in *Optics Letters,* Vol. 24, No. 12, Jun. 15, 1999, pp 826–828, cited and incorporated by reference in the Background of the Invention, above.

In accordance with the principles of the present invention, and as shown in FIG. 1, after a very short generation time ($t_g$ 0.03 ms, for example) the telecommunications VECSEL will operate single frequency on a mode closest to MQW gain peak. The gain (solid bell-shaped line) will be clamped to the cavity loss value (horizontal dashed line) at this operating mode frequency (clamp is denoted by small full circle). If the temperature of the MQW active region is changed, for example by changing the temperature set point value of a thermoelectric cooler (element 112 in FIG. 3) of the VECSEL semiconductor structure, the gain maximum will move to a higher or lower frequency, corresponding to an adjacent optical telecom channel. The VECSEL will remain in the same mode until the gain maximum reaches a half-distance between the two adjacent modes. At this point due to ever present perturbations (either spontaneous emissions or mechanical perturbations, for example) the laser will manifest intermittant (mode hopping) behavior. As the gain curve is thermally moved further, the laser will start lasing single mode on arrival at a mode adjacent to the departure mode. This experimental behavior of a non-stabilized VECSEL having a cavity length of 2.5 cm and with an InGaAs active region is shown in FIG. 2. FIG. 2 shows a very stable single mode operation with very low frequency drift approximating 6 MHz per minute, even though the laser case temperature was not stabilized, and the external mirror spacer was provided by the aluminum base plate. FIG. 2 shows zones of intermittent behavior when the gain maximum is located equidistantly between two adjacent modes. Since the cavity design of the VECSEL of the present invention enables only operation on a particular telecom channel frequency, temperature tuning of this VECSEL provides a very efficient and stable way to tune from one telecom channel to another. Tuning range of this VECSEL depends on the band gap energy dependence of the active zone materials. Temperature tuning coefficient of the laser described in the September 2000 JOSA-B paper referred to herein above was 0.45 nm/° C. By changing the temperature set point to the range of ±25° C. with respect to room temperature, a tuning range of approximately 23 nm can be realized.

The spectrum of the laser will reach a stationary state at some time $\tau_{sp}$, which is determined by the spontaneous emission rate into the cavity modes, and it can be found from equation (4):

$$\tau_{sp} \cong \frac{M_0^{st}}{\gamma \xi}, \tag{4}$$

where $M_0^{st}$ is the intensity (photon number) of the central mode, and $\xi$ is the ratio of the spontaneous emision rate into one laser mode to the stimulated emision rate per photon, (which is close to unity). The spectrum of the laser in this stationary state will have a Gaussian shape with a width which can be evaluated from equation (1). If it is assumed that the power output of the VECSEL is 10 mW, then the photon number in the central mode will be $3 \cdot 10^8$ photons, $\tau_{sp}$ will then be 1.7 seconds, the width of the Gaussian spectral distribution will be 0.17 GHz, and relative intensity of the nearest neighbor to the lasing mode will be $4.7 \cdot 10^{-5}$ or −43 dB.

Figure 3:
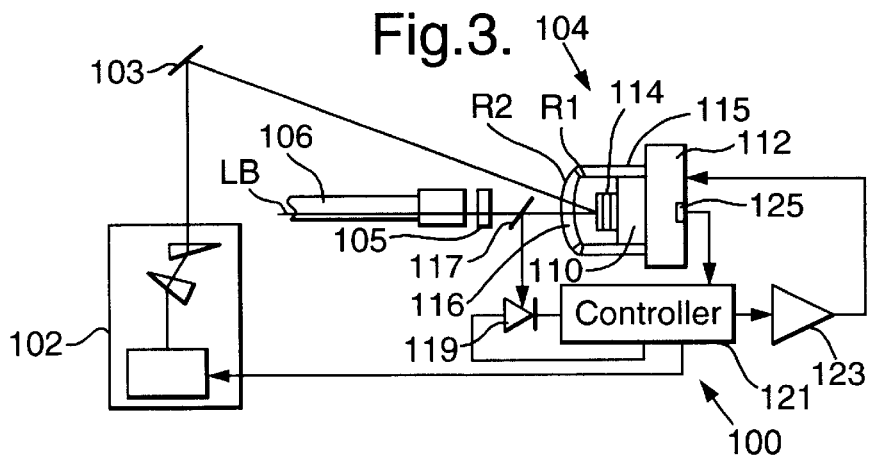
FIG. 3 is a schematic diagram of an optical fiber transmitter unit including an optically pumped MQW VECSEL in accordance with principles of the present invention.

A fiber optic telecommunications transmitter 100 is diagrammatically illustrated in FIG. 3 for putting modulated optical power emitted by a VECSEL 104 into an optical fiber 106 of a communications network operating in the near infrared spectrum, e.g. 1000 nm to 1700 nm and having a multiplicity of spaced apart channels therein, e.g. 12.5 GHz or 25 GHz adjacent channel spacing. A suitable amplitude modulator 105, such as a lithium niobate or lithium tantalate crystal, or other electro-optical element or grating having a current-modulated index of refraction or electroabsorption modulator, for example, is preferably included in the radiation path of the VECSEL 104 in order to impart the necessary information signal to the VECSEL laser beam before passing into the optical fiber 106.

A laser diode unit 102 puts out optical pumping radiation at a desired wavelength, e.g. 980–1000 nm (1.24 eV at 300K), and power level, e.g. a minimum of 150 mw and typically 250 mW to 1 W. When excited by e.g. 150 mW of pump power, the VECSEL 104 puts out 5 mW in the near infrared spectrum, e.g. 1560 nm, and output power scales up as a function of pump power. A folding mirror 103 may be provided to direct the pump radiation toward the VECSEL 104 which has a relatively short cavity, e.g. on the order of 6 mm, between an intrinsic DBR mirror 126 of a semiconductor structure 114 and an external cavity mirror 116.

Other elements of the VECSEL 104 include a heat sink 110, a thermoelectric cooler 112 for wavelength control (mode selection), and an epitaxially grown inverse semiconductor structure 114 including the antireflection layer 122, the MQW active gain region 124, the DBR mirror layers 126 and metal film mirror layer 128 adjacent heat sink (base plate) 110.

A spacer 115 supports an external mirror 116 in place over the top surface of the semiconductor 114 at a precise distance establishing the VECSEL cavity spacing in a range between 0.5 mm and 50 mm, (approximately 6 mm in the present example). While the spacer shown in FIG. 3 is cylindrical, it may have a variety of geometric shapes and be comprised of a single integral element, or several integral or discrete elements such as posts, pillars, a trough, or any other shape desired for or dictated by a particular application. Thus, the term "spacer" as used herein includes multiple structural elements as well as single integrated structures.

The spacer 115 precisely fixes a VECSEL cavity mode separation to be equal to dense wavelength division multiplex ("DWDM") channel spacing of the optical telecommunications network. The ITU established DWDM telecommunications band at 190 THz, with 25 GHz channel spacing, requires an accuracy of absolute mode positions equal to 2.5 GHz. In order to provide absolute frequency control of each mode equal to ten percent of the nominal channel spacing, a VECSEL cavity length precision on the order of $1.25 \times 10^{-5}$ ($\Delta L/L$) is required.

The spacer 115 is most preferably formed of a material, such as a molded glass component, (e.g. ULE glass, quartz, Zerodur™ or other glass or metal such as Invar™ having a low coefficient of thermal expansion) which thermally decouples the external mirror 116 from the semiconductor structure 114, so that temperature regulation of the active region 124 with the thermoelectric unit 112 and heat sink 110 does not change the length of the VECSEL cavity. The spacer material can be selected to compensate for changes in the length of the semiconductor structure 114 when the structure is heated. For example, if the semiconductor structure elongates with temperature, the spacer material is chosen to expand with temperature by an appropriate amount to offset any change in wavelength which would otherwise result. With a spacer made of fused silica having a thermal expansion coefficient α of $10^{-6}$, channel separation will be maintained within a temperature change of plus or minus ten degrees C. Spacer materials such as Zerodur ensure mode positions within temperature changes of plus or minus 100 degrees C. The VECSEL absolute cavity length during manufacture should be reproducible within 0.4 micron. Contemporary optical manufacturing technology can provide thicknesses of optical materials within 0.5 micron. In order to assure that the absolute cavity length is within specification, trimming of the cavity length under optical feedback control is used to meet the required cavity length tolerance.

The external mirror 116 may be a separate element bonded onto the end of the spacer 115, or it may be formed integrally with the spacer. The mirror 116 may be molded to the radius R1 with the aid of a diamond turned metal preform or shaped to a desired spherical contour by any other known method. The mirror surface of structure 116 is of a very high reflectance, and it has a desired spherical radius of curvature R1 relative to the MQW active gain region to define a first highly reflective concave surface. The mirror 116 and the semiconductor structure 104 form a VECSEL cavity having sufficiently high finesse to realize effective single mode lasing operation when excited by an appropriate level of optical pumping energy. The interior ambient environment of the VECSEL 104 may be dry air, helium, nitrogen, vacuum, or another medium, depending upon an acceptable scattering/absorption tolerance as may be required by a particular application or embodiment.

The external mirror 116 may have an outer curvature of radius R2 forming a coupling lens for focusing the pumping energy into the active region 124 and/or for focusing the VECSEL laser emission beam into the optical fiber 106. Losses in the laser cavity of VECSEL 104 need to be low enough so that the gain of the MQW active region is sufficient to overcome those losses. An external mechanical/optical coupler 108 may be provided to position a fiber end and couple the VECSEL laser beam into the fiber 106. Other laser/fiber coupling arrangements known in the art may also be employed to position and stabilize the components and to couple effectively the VECSEL laser beam into the fiber.

The optical transmitter also preferably includes a beam splitter 117 in the output laser beam path which directs a component of output radiation into a photodetector structure 119. The photodetector provides optical feedback information in the form of electrical signals to a controller 121, most preferably a programmed digital controller. The digital controller 121 generates thermoelectric cooler control signals which are suitably converted into driving currents by an amplifier 123 and applied to control the thermoelectric cooler 121. In some embodiments it may improve performance of the transmitter 100 to include a temperature sensor 125 within the body of thermoelectric cooler 121 and feed sensed temperature values back to the controller 121. The digital controller can also feed back pump laser current control values to the pump laser to control pump radiation to maintain a constant output power out of the VECSEL via higher pump power levels at the edges of the tuning range where VECSEL gain is not as high. The digital controller 121 typically includes analog to digital and digital to analog conversion circuits well known to those skilled in the art and not included within the FIG. 3 illustration.

Figure 4:
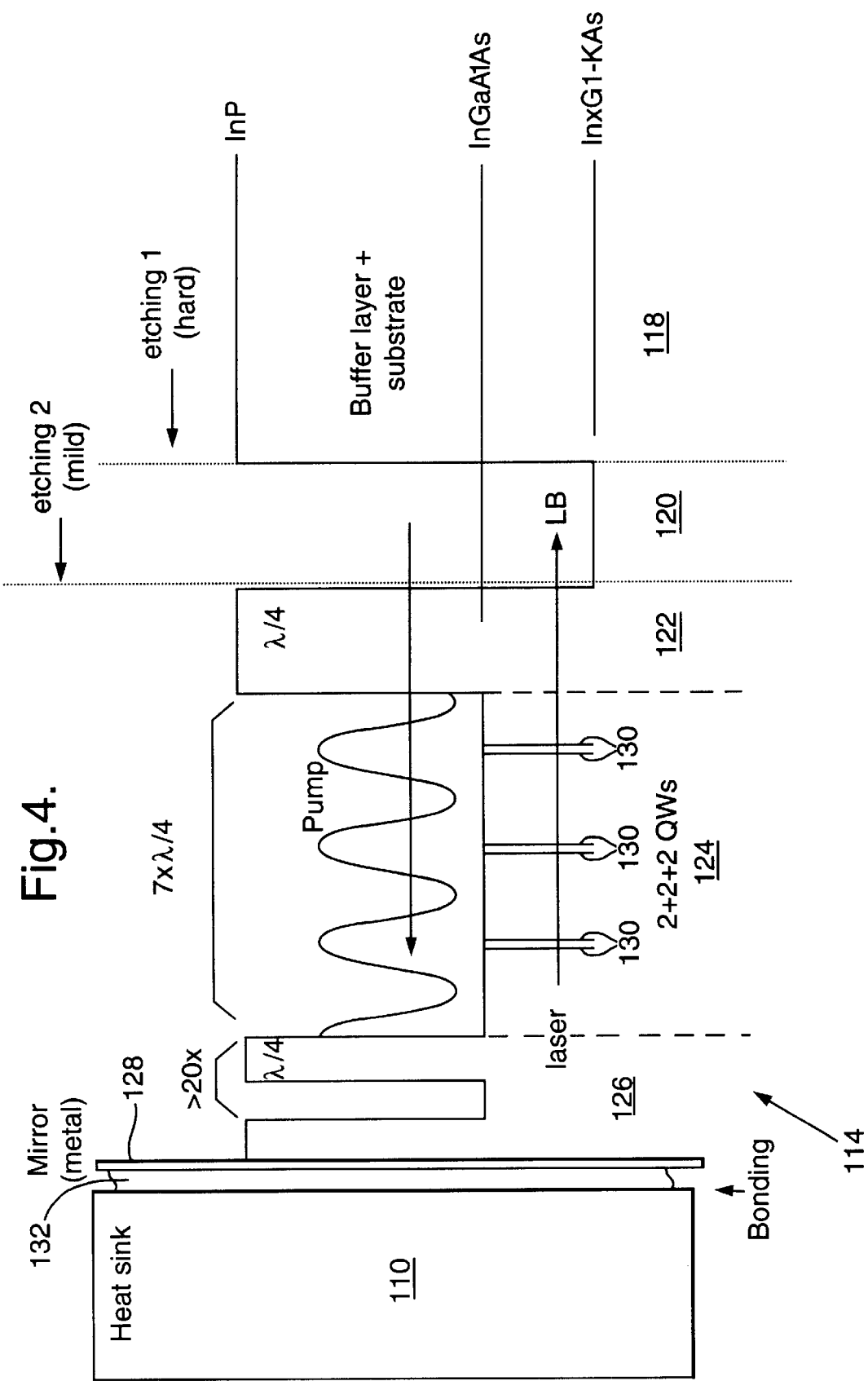
FIG. 4 is a band gap energy diagram superimposed upon a diagrammatic cross section of an epitaxially-grown semiconductor structure preparatory to inverse structure processing into the FIG. 3 semiconductor VECSEL.

We have previously indicated that even though the transmission of the DBR mirror 126 of the semiconductor structure is very low, a small amount of the transmitted light reflected from the back side of the substrate can reenter the cavity. This small amount of light can introduce a spectral perturbation which has the form of fringes with the spectral period defined by the optical thickness of the substrate. Such modulation is unwanted and may impede smooth tuning from one mode to another. We have found that this effect can be significantly reduced by providing a wedge-shape to the substrate of several degrees. However, for telecom applications, such wedge shape may not be sufficient to remove this effect because the VECSEL will operate in a stationary state and the influence of the light scattered from the substrate may prove to be strong enough to perturb smooth tuning from mode to mode. In order to exclude completely any optical perturbation from the back side of the substrate, we deposit a non-transparent metal film layer between the DBR and the substrate. In order to make this approach practical, we employ a reverse order epitaxial process in which the epitaxial structure is grown in reverse order. As shown in FIG. 4, for the exemplary telecommunications transmitter 100, the semiconductor structure 114 is grown in reverse order on buffer layer 120 most preferably by molecular beam epitaxy: AR layer 122, then active region 124, then DBR mirror 126 and finally metal film layer 128.

The VECSEL semiconductor structure 114 is most preferably grown on a substrate 118 comprising InP having an etch stop layer 120 of $In_xGa_{1-x}As$, where x and 1−x represent chemical mole fractions of the respective elements of the crystalline buffer layer material. As grown in reverse order, the first or bottom layer comprises the antireflection layer 122 of an λ/4 thick indium phosphide capping layer and an indium gallium aluminum arsenide layer of a thickness 5λ/4 where lambda represents the VECSEL nominal mid-band output wavelength, 1560 nm, for example. The function of the antireflection layer 122 is to prevent reflection within the semiconductor structure at the VECSEL lasing wavelength, as opposed to the pumping wavelength. Since the VECSEL 104 is pumped through the external mirror 116 or through some other lens or opening through spacer 115, the antireflection layer 122 should be of a material selected for minimal absorption of energy at the pump wavelength, so that a maximum pump power will enter the active region, excite the quantum well carriers and yield efficient lasing. For telecommunications it is necessary that the antireflection coating 122 be effective across the entire optical communications band, and not just a single channel.

A positive gain, active region 124, in one example having a length 7×λ/4, is then formed and has, for example, three pairs of quantum wells 130 of indium gallium arsenide. While FIG. 4 illustrates an arrangement of pairs of quantum wells 130 with each pair arranged at a peak of the optical standing wave, other arrangements can be employed when optical pumping radiation enters the active gain region 124 via the antireflection coating 122, such as three-two-one. In this alternative arrangement three quantum wells are at an optical peak nearest antireflection coating 122, two are at a middle peak, and one is at a peak distant from the antireflection coating. In the near infrared spectrum, quantum wells typically have less gain than in the visible spectrum, and a sufficient number of quantum wells must be provided to yield the needed gain for reliable operation at the desired output power. Each quantum well 130 has a thickness designed in relation to the desired output wavelength at operating temperature (which, because of absorption of the pump energy, will be higher than room temperature). When the active region 124 is pumped, it heats up. When a semiconductor is heated, it changes effective thickness and index of refraction. Accordingly, the emitting wavelength of the quantum wells 130 must be shifted to a higher energy level compared to a room-temperature design wavelength of the structure: $\lambda_{QW} \approx \lambda_{DESIGN}-20/30$ nm approximately (at $T_o=300K$, at low excitation), so that the gain and the design wavelength match when the VECSEL 104 is lasing.

As shown in the FIG. 4 diagram, each pair of quantum wells 130 is located at a maximum of the active region standing wave. Major separation or barrier layers between the quantum well pairs have a length optimized for an absorption coefficient at the pump radiation wavelength which in this example is 980 nm. FIG. 4 not only shows a diagrammatic cross section of the layers of the semiconductor structure 114, it also plots relative band gap energies of the various semiconductor layers 120, 122, 124, and 126.

A distributed Bragg reflector (DBR) layer stack 126 is then formed on top of the active region. The DBR 126 comprises an odd number of quarter-wavelength interleaved layers, preferably greater than twenty pairs, plus one layer, to achieve an odd number of quarter wavelengths. The DBR layers comprise alternating indium gallium aluminum arsenide, and indium phosphide quarter wave layers, so that total reflectance within the DBR at the design wavelength is greater than 99 percent. Finally, a metal film mirror layer 128, e.g. gold or gold alloy, is sputter-deposited onto the DBR structure 126 to complete the fabrication of the semiconductor structure by the epitaxial process. The mirror increases the reflectance from 99 percent to approximately 99.5 percent. Index matching and phase discontinuity issues are essentially avoided by using both the DBR mirror structure 126 and the metal mirror 128.

The effective length between the DBR 126 and the external surface of the antireflection coating 122 is set to an odd number of nominal output quarter wavelengths, subcavity formed by the semiconductor structure 114 operates in anti-resonance. The pumping energy passes through an antireflection coating 122 to reach an active 124 of quantum wells.

For a fundamental transverse electromagnetic mode (TEM$_{00}$) operating wavelength of 1560 nm in the near infrared spectrum and at the design operating temperature (300K), the various layers of the semiconductor structure 114 from the gold 128 to the external surface formed at the outer end of the antireflection layer 122 are given in the following table:

| Reference No. | Layer Material | Layer Thickness |
|---|---|---|
| 126 | InP (Phase matched to metal) | 901 Angstroms |
| 126 | InGaAlAs (22 layers) | 1117 Angstroms |
| 126 | InP (22 layers) | 1240 Angstroms |
| 124 | InGaAlAs | 1681 Angstroms |
| 124 | InGaAs (QW) | 53 Angstroms |
| 124 | InGaAlAs | 150 Angstroms |
| 124 | InGaAs (QW) | 53 Angstroms |
| 124 | InGaAlAs | 150 Angstroms |
| 124 | InGaAs (QW) | 53 Angstroms |
| 124 | InGaAlAs | 150 Angstroms |
| 124 | InGaAs (QW) | 53 Angstroms |
| 124 | InGaAlAs | 150 Angstroms |
| 124 | InGaAs (QW) | 53 Angstroms |
| 124 | InGaAlAs | 150 Angstroms |
| 124 | InGaAs (QW) | 53 Angstroms |
| 122 | InGaAlAs | 1231 Angstroms |
| 122 | InP (capping layer) | 1117 Angstroms |
| 120 | In$_{0.53}$Ga$_{0.47}$As | 3000 Angstroms |
| 120 | InP (buffer layer) | 5000 Angstroms |
| 120 | InP Substrate | |

Figure 5:
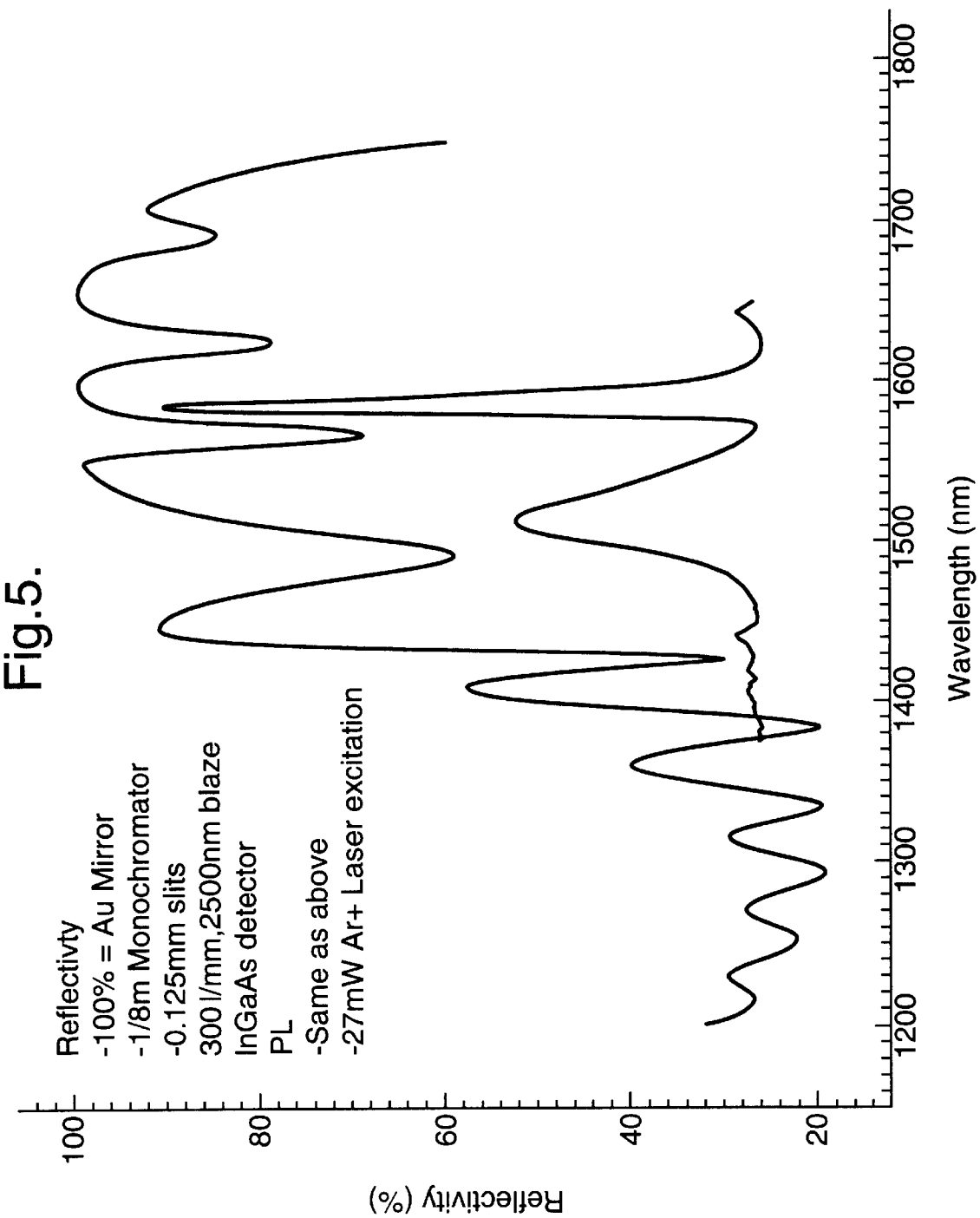
FIG. 5 is a graph of reflectivity (upper trace) and photoluminescence (PL) (lower trace) measurements made of a sample of the FIG. 3 VECSEL having an indium phosphide semiconductor structure along a wavelength baseline.

FIG. 5 presents a graph superimposing an upper sinuous line representing measured reflectivity of a sample semiconductor structure 114 in accordance with the above table, and a lower sinuous line representing measured photoluminescence of the same sample.

After the epitaxial deposition processes are complete, the indium phosphide substrate 118 is removed by an abrasion step, such as ion beam milling. The indium gallium arsenide etch stop layer 120 is then removed by a second step of wet chemical etching with an etching agent which favors removal of the gallium arsenide substrate 120 (rather than the indium phosphide capping layer within the antireflection layer 122). As indicated in the table above and in FIG. 4, a dielectric layer of appropriate thickness is then vacuum deposited onto the InP capping layer in order to complete the e.g. 5λ/4 thick antireflection layer 122 and made to have proper P polarization as with a λ/2 plate, the ellipticity turns into a circular pattern at the surface. A wafer including multiple ones of semiconductor structures 114 is then diced to yield individual semiconductor dies or "chips".

The metal mirror layer of a said chip 114 is then bonded to a silicon substrate or soldered to a copper heat sink 310. By removing the substrate 320 in this preferred reverse order formation process, thermal control of the active region 324 via the thermoelectric element 312 and the heat sink 310 is much more direct and positive, than if the heat had to be conducted through the substrate, as is the case with conventional VECSEL and VCSEL designs.

For example, within a telecom application, a thermal control loop comprising elements 117, 119, 121, 123, 112 and 125 shown in the FIG. 3 example is most preferably employed to establish and maintain a central or reference wavelength within a multi-channel optical band. As shown in the FIG. 1 graph, the VECSEL 100 will lase on a mode closest to gain maximum. When the temperature of the quantum well active region 124 is changed, the maximum of the gain shifts with a tuning of approximately 30 GHz/degree C. This tuning range suggests that if the temperature of the gain structure is kept stable within 0.1 degree C, such thermal regulation will ensure that the VECSEL will be lasing on a single selected mode. This approach avoids the drawbacks of absolute temperature control required for existing DFB lasers designed for use in the optical fiber telecommunications industry.

As shown in FIG. 2, when the gain maximum is thermally tuned to a position corresponding to the middle between two adjacent modes, the VECSEL 104 will intermittently lase on one or the other mode. If the laser is alternating between two modes, such alternation can be detected by providing the photodiode assembly 119 with frequency selective-filtering characteristics. By thermally tuning the telecommunications VECSEL 104 over the entire frequency range, it is practical to detect all set points corresponding to gain positions exactly between the modes. These positions are then stored in the digital control unit 121 enabling an exact match between temperature set points and the DWDM channel to be computed and presented to the active gain region 124 via the thermoelectric cooling unit 112. This particular method enables thermal compensation over time for changes in the semiconductor structure materials of the VECSEL 104 due to material aging, for example. The digital control unit 121 also controls a startup sequence of the pump laser 102 and regulates pump power during steady state operation, so that the VECSEL 104 is started single mode and remains single mode during operation.

The intermittent, mode hopping behavior shown in FIG. 2 is most preferably used to determine automatically the relationship between temperature set points and telecom channel numbers. The temperature set points should correspond to the situation where the gain curve maximum coincides exactly with the corresponding mode, as illustrated in FIG. 1. As seen in FIG. 2 the intermittent laser behavior takes place when the gain maximum is located exactly between two modes, and the temperature range corresponding to such intermittent behavior is significantly smaller than the temperature increment necessary to move the laser from one mode to its nearest neighbor mode. Thus, these temperature set points can be determined with a very high precision by observing the laser output with monitor photodiode 117 which has in front of it a filter having an optical transmission gradient which varies from a low of a few percent, value to a high, near 100 percent, value across the telecom wavelength range. With such a detector, which is AC coupled to the controller 121, the jumping of the laser from mode to mode will result in intense random spikes (mode transitions) which produce digitized values and intervals readily detected by the control unit 121.

A presently preferred method for laser self-calibration is as follows:

The control unit 121 sets the laser temperature set point to its lowest negative value causing the thermoelectric cooler 112 to reach its lowest nominal operating temperature. Then, the control unit 121 causes the temperature to increase over a calibration time interval. The control unit 121 continuously monitors laser output to detect mode transitions, and it records the temperature control parameter for that particular transition in memory, most preferably a non-volatile electrically rewriteable memory within controller 121, such as a "flash" memory element or array. This operation of detecting mode transitions and recording thermal control parameters continues until a maximum positive temperature set point is reached. The control value for the first mode is then given the value of one half the first thermal control parameter, the control value for the next mode is then determined as a value of the median between the second and third recorded control parameters, and so forth, until all control values within the thermal control range are determined. This dependence can be expressed as a low order polynomial such as Ut(n), where Ut is, for example, the control voltage input to the thermoelectric cooler 112. Then, the control value of the temperature control (corresponding e.g. to voltage or current) for the first telecom channel accessible by this particular laser will be found as Ut(1), the control value for the second telecom channel will be Ut(2), etc., and finally the control value for the last telecom channel accessible by this particular laser will be found as Ut(n). Obviously, Ut(0.5), Ut(1.5), etc., are the set points corresponding to the gain curve equidistant between the adjacent modes. Finally, absolute wavelength of the first operating channel for the particular laser is determined and recorded in the controller memory (and externally as part of documentation accompanying this particular laser) at the factory by use of an optical spectrum analyzer, such as a Burleigh WA-7100. Once calibrated, the laser will keep the values for a long time. The distance in wavelength units between two telecom channels with 25 GHz channel spacing is 0.195 nm. Provided that the laser temperature tuning coefficient is about 0.45 nm/° C., the tuning from one telecom channel to another will require about 0.4° C. temperature increment. In order to keep the laser operating at the chosen channel frequency, a readily obtainable temperature tolerance of 0.1° C. is sufficient.

After the laser leaves the factory, the automatic calibration of the laser can be repeated in the field or operating environment at any time, and any correction to temperature control values (polynominal coefficients) can be refreshed by the control unit 121 and replaced in memory. No measurement by a spectrum analyzer would be required unless initial laser calibration data is completely lost. This method enables each laser to be maintained in a calibrated state for an arbitrarily long time, which can be expected to approach closely the full useful life of the laser device.

Figure 6:
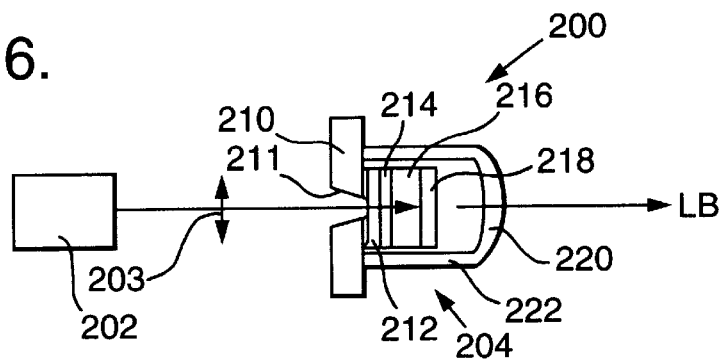
FIG. 6 is a schematic diagram of another optical fiber transmitter unit including an optically pumped MQW VECSEL in accordance with the principles of the present invention.

While the VECSEL 104 shown in FIG. 3 is presently preferred because of its relative simplicity of manufacture, other VECSEL arrangements and configurations are within the scope of the present invention. In FIG. 6, a VECSEL-based telecommunications transmitter 200 includes a laser diode pump 202, a pump beam focus lens 203, and a VECSEL 204. In this configuration, the pump energy enters one side of the VECSEL 204, and the laser energy exits another side of the VECSEL 204. A base 210, made of thermally conductive material such as copper, defines a pump aperture 211. A thermoelectric cooler such as cooler 112 (not shown in FIG. 6) automatically controls temperature of the base 210. A semiconductor structure, formed in reverse order in the same manner as the FIG. 3 VECSEL 104, has a pump-transparent dielectric mirror layer 214, an active gain region 216 and an antireflection coating 218. An external surface of the dielectric mirror layer 214 is polished very smooth and is bonded to a transparent substrate layer 212, such as diamond, by a suitable bonding method or agent. Vacuum bonding by VanDerWalls forces, or peripheral soldering with a solder material, such as indium, is preferred. Since the external lens 220 and spacer 222 are equivalent to the lens and spacer of the VECSEL 304, the explanations given above for those elements apply to the elements 220 and 222. With suitable modifications made clear by the foregoing explanations of structure and function of respective elements, the pump laser radiation could enter the active region of VECSEL 204 via the external mirror 220, and the laser radiation could exit via the aperture 211.

Figure 7:
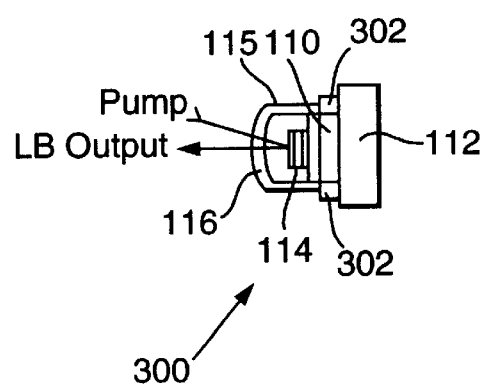
FIG. 7 is a schematic diagram of a MQW VECSEL similar to the FIG. 3 MQW VECSEL with the addition of an annular piezoelectric element for providing micro adjustment of the external cavity length, thereby adding a further wavelength tuning mechanism having a shorter time constant than is achievable with thermal tuning alone.

In cases when single wavelength operation and discrete step-tuning is not necessary, such as in spectroscopy for example, the spacer, instead of being formed of low thermal expansion materials may be made of a material that changes its dimension under external stimulation, such as a piezoelectric transducer, or as a result of changes in external ambient pressure. FIG. 7 shows a MWQ VECSEL 300 in accordance with these principles. VECSEL 300 is similar in structure to VECSEL 104 shown in, and described in conjunction with, FIG. 3, so that common elements bear the same reference numerals and the previous descriptions of those elements apply to the FIG. 7 structure. However, in VECSEL 300 an annular piezoelectric element 302 is sandwiched between the base 110-heatsink 112 and the spacer 115. In this case the VECSEL cavity length can be made even shorter, e.g. 1 mm or even a few hundred microns, and the laser will provide single-frequency mode-hop tuning over several wave numbers (cm$^{-1}$). In this regard it is important that the piezoelectric element 302 apply a uniform force around its circumference, so that the external mirror 116 remains on the optical axis of VECSEL 300 as the cavity is lengthened or shortened.

Alternatively, if the external mirror is coupled to a piezoelectric transducer, the VECSEL will work as a tunable single frequency source. The mode hop free tuning range will be close to the cavity mode spacing, 25 GHz for a cavity length of 0.6 cm. If the cavity length is reduced to about 1 mm for example, the mode hop free tuning range (without synchronous MQW structure temperature tuning) will be 150 GHz, or 5 cm$^{-1}$, which makes the resultant VECSEL a very good source for spectroscopic and gas analysis applications.

Figure 8:
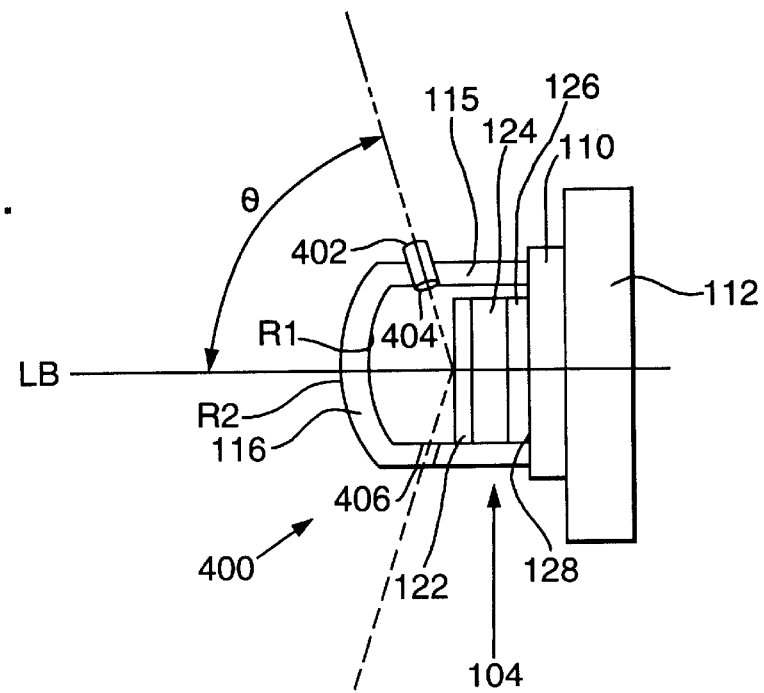
FIG. 8 is a greatly enlarged schematic diagram of a MQW VECSEL similar to the FIG. 3 MQW VECSEL in which a 150 mW DFB diode laser is mounted and aligned to illuminate the VECSEL semiconductor structure at Brewster's angle, in accordance with the principles of the present invention.

A cost-saving improvement can be realized by use of a conventional laser diode pump for directing optical pump radiation at the surface of the semiconductor active region at an angle of incidence equal to Brewster's angle (θ) and with P polarization which maximizes absorption of pump radiation into the semiconductor structure 114 and minimizes reflection at the surface thereto. This arrangement is illustrated in FIG. 8 which shows a MWQ VECSEL 400 in accordance with these principles. VECSEL 400 is similar in structure to VECSEL 104 shown in, and described in conjunction with, FIG. 3, so that common elements bear the same reference numerals and the previous descriptions of those elements apply to the FIG. 8 structure. In the FIG. 8 arrangement 400, a miniature diode laser assembly 402 is aligned and secured within an opening of the spacer 115 of VECSEL 400 so that pump radiation is directed with P polarization at the external surface of the semiconductor structure 104 at an angle analogous to Brewster's angle (θ) i.e., 73.6 degrees. A micro-lens 404 may be included within the DFB laser assembly 402 to collimate the pump beam and limit spot size to between 50 and 70 microns, for example. It is obvious that directing a pump beam from a diode laser having a three to one ellipticity at an angle of incidence analogous to Brewster's angle and made to have proper P polarization as with a λ/2 plate, the ellipticity turns into a circular pattern at the surface and mode mismatches between the pump laser beam and the semiconductor are thereby minimized. In this manner the diode laser assembly 402 need only emit at a power level of 150 mW to obtain the equivalent pump efficiency requiring a much higher power laser pump having a beam not incident at Brewster's angle. 150 mW diode lasers emitting at 980 nm wavelengths are readily available, from sources such as Nortel, JDS and Coset. The pump assembly 402 may include its own integral heat sink and thermoelectric cooler in order to facilitate thermal control of wavelength in addition to direct current control, if desired for a particular application.

The polarization of a conventional 1×3μ high brightness laser diode is oriented parallel to its long emitter side, so as to be opposite to what is wanted in order to pump at large angles of incidence, and thus get expansion of the short diameter due to the large angle. In this case a λ/2-plate will be required in order to rotate the polarization. Such diodes have some astigmatism, that is to say, the virtual point sources which represent the diode radiation have different positions along the diode's Z axis for fast (x) and slow(y) laser diode convergence planes. When imaged with a lens, the diode surface image therefore has different locations for x and y planes. The diode can therefore be oriented so that its polarization is a right P polarization (3μ side in the incidence plane) and some intermediate plane used between the two astigmatic image planes in order to get the spot on the VECSEL semiconductor structure surface to be circular.

The arrangement shown in FIG. 8 is presently preferred as it enables the diode pump laser 402 to be aligned and fixed in place in the factory as part of the VECSEL assembly process and then checked out before delivery to a user. In the event that a small portion of pump energy is reflected by the outer surface of the semiconductor 104, an aperture or other pump-energy absorbing means 406 may be defined in an opposite position in the spacer 115 to prevent or impede further reflection of pump energy within the external cavity of the VECSEL.

As pointed out above, the spacer can be manufactured within a 1μ tolerance. During manufacturing it is necessary to make a final adjustment of spacer length so that it meets the required 0.04μ tolerance in order for the laser mode spacing to equal the telecom channel spacing. This fine adjustment is also required in order to assure that the absolute frequency of any given mode is within the required tolerance equal to the absolute frequency of the telecom channel closest to this mode. It does not matter which mode is tuned to the nearest telecom channel providing the mode spacing corresponds correctly with the telecom channel comb. The channel number can be adjusted in the processor unit 121.

To perform the fine adjustment of the spacer, the VECSEL should be switched on so that it lases single frequency at some mode. Its output radiation is sent to a spectrum analyzer, such as a Burleigh WA-7100 spectrum analyzer, or equivalent, which provides a wavelength measurement accuracy of ±1.5 ppm or ±0.1 9 GHz. The spectrum analyzer will display the actual lasing frequency.

Figure 9:
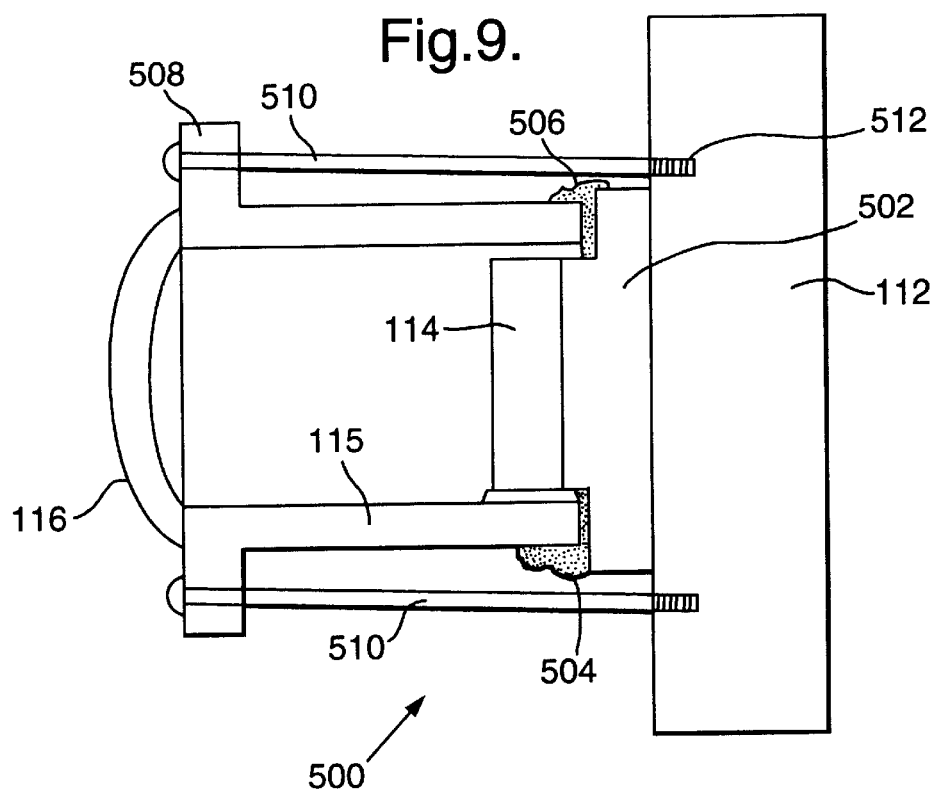
FIG. 9 is a greatly enlarged schematic diagram of a MQW VECSEL similar to the FIG. 3 MQW VECSEL illustrating one preferred arrangement for precisely aligning and securing the external mirror spacer to the heat sink to achieve the cavity precision design length.

With reference to FIG. 9, the mirror 116 is fixed to the spacer 115 in such a way that the border of its spherical surface is sitting on the polished flat surface of the cylindrical spacer. The mirror 116 in a suitable fixture, such as a spring loaded mount, so that by adjustment of the spring, the spacer can be axially displaced relative to a base plate 502 or given a small elastic deformation. The base plate 502 may be provided with a recessed or flanged region 504 sized to present a small interference with the spacer 115 so that the spacer is initially maintained at a starting position. Adjustment of 1μ along the longitudinal axis of the VECSEL 500 while monitoring the spectrum analyzer can readily be made in this manner. Once the spacer is precisely adjusted to provide the external cavity with its precisely correct length, it is securely bonded to the base plate in this position by a bonding agent 506, such as low temperature glass, solder, UV-curable resin system, or the like, (which may be heated and flowed or reflowed incident to this adjustment). Fixing a final position may be achieved by post-tensioning the spacer 115 with three or more tensile members or posts 510 which are automatically adjustably tensioned by computer control in the factory between a flange 508 of the spacer and fine-pitched threaded openings formed in the base plate 112. Other arrangements, such as maintaining a spring bias force on the spacer may be employed with slightly greater mechanical complexity in the completed VECSEL 500.

With some added structural and fabrication complexity, an additional electro-optical control element, such as a thin dielectric tilted etalon having dielectric partial reflective coatings, for example, can be included within the VECSEL cavity. Such an etalon will work as a bandpass filter, and will reduce effective gain bandwidth, thus reducing the time necessary to reach single frequency operation and increasing side mode suppression. The wavelength of the etalon transmission peak should be close to the gain maximum. The tuning of the etalon may be achieved by changing its temperature using a separate thermoelectric cooler element or by changing its tilt angle with a piezoelectric control element or changing the index of it's spacer material electro-optically for example. Correspondence between etalon temperature/tilt angle and a selected channel can be established using a procedure similar to the calibration procedure set out hereinabove. Such an additional element or controllable wavelength filter enables more rapid selection/control of VECSEL emission wavelength than may be realized by thermal control only of the VECSEL active region 114. In addition, the intra-cavity element may be provided to speed up single mode operation and further reduce the possibility that the laser will lase multimode during startup. The closest cavity mode to the transmission peak of this element becomes the chosen operational mode. As the DWDM channel separation is $10^{-4}$ of the telecom channel frequency, positioning of the intra-cavity element's optical peak has to be made with an accuracy of a few percent of the free spectral range. This is readily reproducible with contemporary optical manufacturing techniques. Rapid tuning to a particular channel wavelength can then be carried out by the intra-cavity electro-optical element which effectively changes the cavity length in a controlled manner correlated to the selected channel wavelength. In this manner, from 500 to 1000 separate channels can be realized over a 200 nm VECSEL laser radiation wavelength tuning range centered at e.g. a 1560 nm wavelength.

Figure 10:
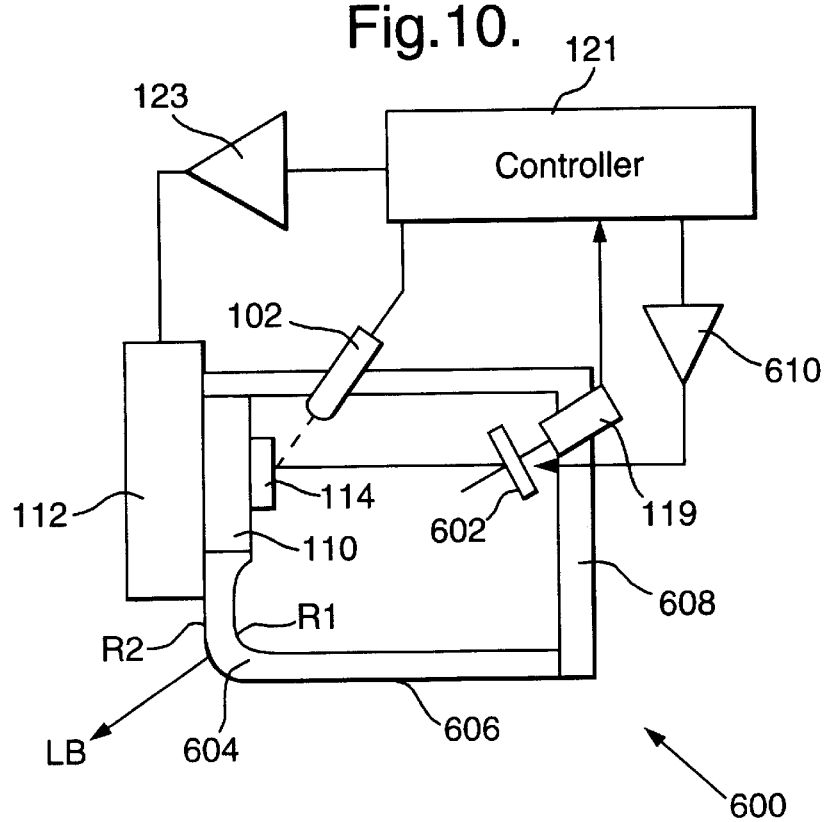
FIG. 10 is a greatly enlarged schematic diagram of a MQW VECSEL incorporating principles of the present invention and further including an intra-cavity etalon enabling rapid mode selection.

FIG. 10 sets forth a greatly enlarged schematic diagram of a VECSEL 600 including an intra-cavity element 602 forming a mirror for reflecting optical energy emitted by the semiconductor structure 114 to a spherical mirror 604. A two-part spacer includes a generally cylindrical body 606 which defines the mirror 604, and further includes a plate 608 which aligns and secures the intra-cavity element 602. The etalon 602 may be partially transmissive, and the monitor photodiode 119 then can be mounted to the plate 608 behind the etalon 602. The controller 121 includes an etalon driver 610 for driving either a thermoelectric cooler or a piezoelectric transducer which controls the etalon 602 in the manner described above.

The present embodiments of the stepwise tunable, extended active mirror laser (STECAM) comprise an active mirror with a gain bandwidth sufficient to overlap several modes of the overall cavity formed between that mirror and another external mirror and some means of selecting and the cavity mode that oscillates and of altering that selection. In one preferred embodiment, that selecting means is a tuning element placed inside the cavity. In some preferred embodiments described below, the amplifying mirror is fabricated as a surface emitting laser gain structure and the STECSL becomes a vertical extended cavity surface emitting laser (VECSEL) in previous parlance. In another preferred embodiment, the amplifying mirror is fabricated as an edge-emitting semiconductor optical amplifier (SOA).

In connection with the Figures, we have described various implementations of a method of providing frequency-switched radiation for optical communications or spectroscopy. Said method comprises shifting the transmission band of a wavelength dependent intra-cavity mode selector in a STECAM cavity by means of an externally applied electrical signal. The STECAM cavity is designed to have fundamental axial modes at pre-specified wavelengths of use in communications and spectroscopy, and the action of the mode selector is to choose which of them lases at a given time, not to tune a wavelength about its pre-specified value. The use of electro-optic media such as lithium niobate, lithium tantalate and smectic and nematic liquid crystals in the tuning element allows the radiation wavelength to switch on a millisecond and faster time scale, much more rapidly than mechanical tuning means. The dynamics of the STECAM cavity is such that no radiation is produced at unwanted wavelengths or frequencies.

Further details of embodiments of the intra-cavity tuning element of the present invention are delineated schematically in the following FIGS. 11–20. For these embodiments, the gain spectrum of the amplifying mirror is assumed to be less sharply peaked than in FIG. 1. The layer design of the required MQW and DBR structures are only slightly different than those illustrated in FIG. 4 and FIG. 5. When the gain spectrum is relatively flat, there is a need for an intra-cavity element to select one cavity mode for oscillation. However, once the power in that mode increases, saturation suppresses the gain of the other modes as shown in FIG. 1. The intra-cavity element is intended to select one of several cavity modes for oscillation, but not to alter the frequencies of those modes, which are determined by the overall length of the optical cavity.

Figure 11:
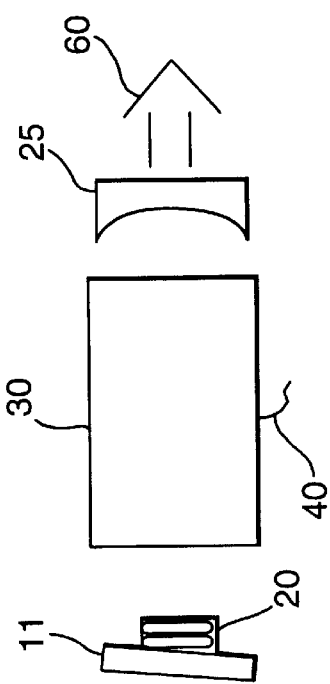
FIG. 11 schematically illustrates an embodiment of a VECSEL in accordance with the present invention having a resonator incorporating an amplifying mirror and an electronically adjustable tuning element within the laser cavity.

In the drawings, wherein like components are designated by like reference numerals: FIG. 11 schematically illustrates a vertical external cavity surface emitting laser (VECSEL) in accordance with the current invention. The amplifying mirror 20 along with the concave mirror 25 constitute the laser cavity. The output beam is shown schematically as 60. A heat-sink device 11 is outside the cavity but forms part of a mechanical support structure (not shown). The electronically adjustable frequency selective element 30 responds to externally-originated electrical signals sent on cable 40 by switching the laser output 60 from one frequency to another.

Figure 12:
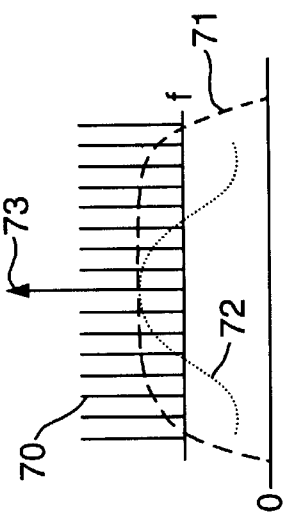
FIG. 12 is a graphical representation of the spectra of the resonator 70, amplifying mirror gain 71 and tunable element 72 wherein the gain is flatter than that shown in FIG. 1.

FIG. 12 illustrates the spectral relationships of the components in FIG. 11. The cavity formed by the mirrors 20 and 25 produces a spectrum of modes 70 equally spaced in frequency. The frequencies of the modes are chosen so that a subset of them or all of them correspond to desired communications channels or desired molecular absorption signatures. The gain spectrum 71 of the amplifying mirror 20 is substantially uniform across a considerable portion of the mode spectrum, which would normally give rise to multi-mode oscillation and/or unstable competition among the modes. The frequency selective device 30 has a transmission spectrum 72 that has a maximum for only one mode 73 within the gain band of the amplifying mirror 20. The combination of the gain of the amplifying mirror and the transmission of the frequency selective element causes the selected mode 73 to rise in power until it depletes all the inversion available in the homogeneously broadened gain medium. Thus only mode 73 oscillates, and does so stably, without competition from near-threshold modes. Note that it is not necessary that the frequency selective element 30 act as a high contrast or narrowband filter. It is sufficient that the net unsaturated gain of one preferred mode exceed the net unsaturated gain of each of the other modes. An electronic signal applied to the mode selective element 30 via cable 40 causes the peak of the transmission of the mode selective element to rapidly switch from the oscillating mode 73 to any other mode within the gain spectrum 71. That switch extinguishes oscillation in mode 73, but laser radiation is not produced in any of the other modes until three requirements are met:

1) Sufficient pump power is absorbed to create an inversion sufficient to produce non-zero net gain in any of the previously-sub-threshold modes.

2.) The peak transmission of the mode selective element arrives at the frequency of another mode.

3.) Photons spontaneously emitted at the new mode frequency make sufficient cavity round trips under low-loss, high-gain conditions to build up a significant intra-cavity laser power.

Since the VECSEL cavity has a high Q (low loss) and the amplifying mirror has low gain, this $3^{rd}$ requirement is relatively time consuming compared to requirement 2. In particular, there is insufficient time for cavity power build up to occur in the modes between the initial cavity mode extinguished and the final one designated as the mode selective element peak traverses their frequencies.

In an alternative embodiment of this invention, the energy input (e.g. from a pump laser) to the amplifying mirror is briefly reduced whenever the peak transmission of the mode selective element traverses the frequency of an unwanted mode to ensure that it does not reach threshold.

Figure 13:
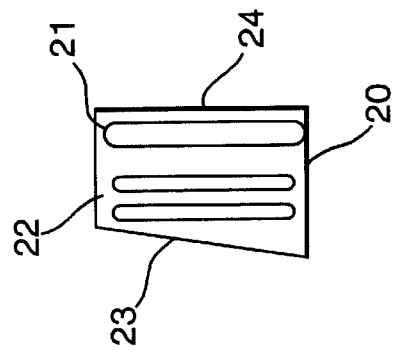
FIG. 13 is a representation of an embodiment of the amplifying mirror incorporating a Bragg reflector region and a gain region combined within a monolithic structure.

Returning again to the drawings, FIG. 13 illustrates one embodiment of the amplifying mirror 20, wherein it contains a gain region 21 and a Bragg reflector region 22, both fabricated out of semiconductor materials such as InP, InGaP and InGaAsP. In this embodiment, the amplifying gain region 21 comprises layers of quantum-well material separated by layers of material transparent over the gain bandwidth 71 of FIG. 2 although not necessarily transparent at a pumping wavelength—said quantum well layers being disposed at the anti-nodes of the cavity axial mode created by reflections from the Bragg reflector region 22 and the concave mirror 25 shown in FIG. 11. The reflectivity of the reflector region 22 is greater than 95%, but it is necessary to suppress variations in net reflectivity as a function of wave length due to reflections from surfaces behind the reflector region 22 with respect to the gain region 21 (i.e. the wafer substrate) by a factor of at least $10^4$. In the amplifying mirror embodiment shown in FIG. 13, the back surface 23 of the mirror 20 is tilted to prevent such reflections propagating back into the optical cavity. It will be recognized that other means of suppressing such wavelength dependent reflectivity variations interferences are possible, including depositing a completely opaque film on back surface 23. It is also desirable to suppress any phase variation of the reflection from that medium, i.e. 22 plus 23 such as depositing an opaque layer close to the outermost layer of the reflector region. The surface of the amplifying mirror inside the resonator 24 is also positioned or treated (e.g. coated) to suppress wavelength dependent reflectivity over the gain band of the amplifying mirror.

Figure 14:
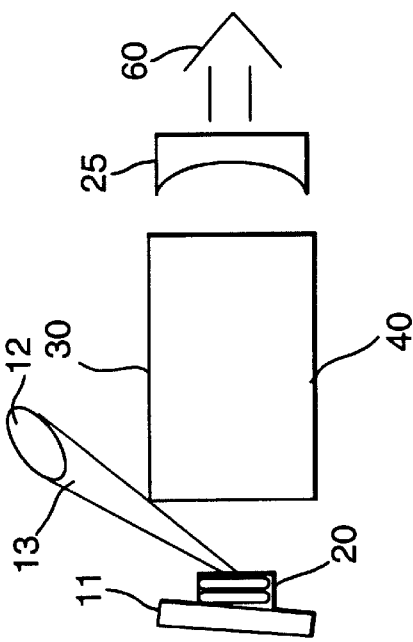
FIG. 14 illustrates an embodiment of the present invention in which the amplifying mirror is excited optically by a laser beam originating outside the cavity.

FIG. 14 illustrates an embodiment of this invention in which the amplifying mirror 20 is excited by a pump laser beam 13 focused on the amplifying mirror 20 by a lens 12 outside the cavity formed by mirrors 20 and 25. The pumped spot on the mirror 20 is chosen to ensure single transverse mode operation, in this embodiment. This can be achieved for example by using a pump beam which has the following characteristics:

1) a transverse electromagnetic zero/zero mode($TEM_{00}$);
2) a circular projection spot onto the amplifying mirror 20; and
3) the projection spot is of such a size as to permit lasing only in a TEM zero/zero ($TEM_{00}$) transverse mode but not in any higher order transverse modes.

One skilled in the art will recognize that other optical pumping geometries are possible, including some with multiple beams and others that would access the gain region 21 through the reflector region 22 shown in FIG. 13. Such geometries are other possible embodiments of this invention. The pumping laser beam 13 has a wavelength that is absorbed in the gain region thereby causing population inversion in the quantum structures, thereby producing gain.

In another embodiment, the amplifying mirror is pumped electrically in the same manner used for a vertical cavity surface emitting laser (VCSEL) without an external (extended) cavity. The heterostructure diode structures necessary for electrical pumping, carrier confinement and optical field confinement are known art in the VCSEL field.

Figure 15:
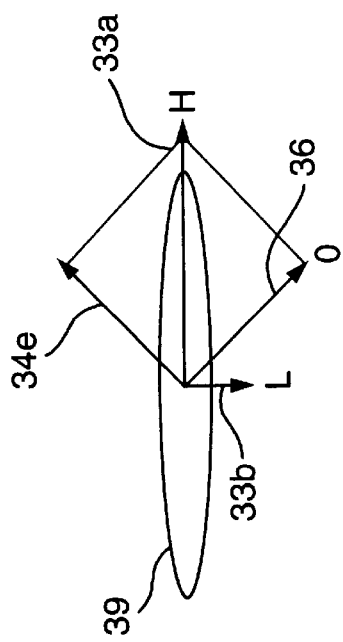
FIG. 15 illustrates an embodiment of an electronically adjustable tuning element in which a tilted plane etalon with an electro-optically active spacer and a polarization selective element constitute the tuning device.

FIG. 15 illustrates an embodiment for the mode selective element 30 wherein a thin plane Fabry Perot tilted etalon 31 transmits light at the mode desired for oscillation but reflects sufficient light at other frequencies to discourage oscillation. This element can be used to provide a signal showing the degree of mutual detuning of tuning element and cavity modes for any given control voltage without perturbing the operation of the laser. This will allow keeping the tuning element transmission maximum always in coincidence with the cavity modes and at the same time compensate for any thermally induced change of the optical element. This property is achieved due to $$\frac{dn}{dT} \text{ and } \frac{d\Delta n}{dT'}$$

being equal where n is the index of refraction. The spacer medium of the etalon is an electro-optical material bounded by conductive, partly transmitting mirror surfaces onto which a voltage can be applied by means of cable 40. The index of refraction n of the spacer medium varies with applied voltage, according to:

$$n(V)=n_o+\lambda_o/2d \; V/V_\pi$$

or $$n(V)=n_o-n_o^3 rV/2t,$$

where $n_o$ is the index of refraction of the spacer medium with no applied voltage, V is the applied voltage, $V_\pi$ is the voltage necessary to achieve a π radian change in optical phase, t is the etalon thickness, $\lambda_o$ is the center optical wavelength of the gain band, and r is the electro-optic coefficient of the spacer medium. Thus the shift in peak wavelength of the transmission function for the tilted etalon is:

$$\Delta\lambda(V, \theta)=-\lambda_o n_o^4 rV/2d(n_o^2-\sin^2\theta)^{-1/2}.$$

Since electro-optic media are typically birefringent, it may be necessary for the light within such a frequency selective element to have a single polarization. This can be achieved by means of a polarization selective element 32. Adequate low-loss polarizers are known and include prisms with Brewster angled surfaces, thin films with polarization sensitive reflection coefficients and Glan-Thompson birefringent polarizing prisms. In order for the etalon 31 to have only a single transmission maximum within the gain band of the amplifying mirror (FIG. 13), the spacer thickness t must be less than $$t<\lambda_o^2/(2n_o\Delta\lambda_G)$$

where $\Delta\lambda_G$ is the wavelength band producing gain (71 in FIG. 12). The spacer thickness t is small, and the voltages required by conventional electro-optic crystals to tune by changing refractive index over $\Delta\lambda_G$ (~$V_\pi$) may be prohibitively high. However, nematic and smectic liquid crystal media capable of adequate change in refractive index at low voltage are known and used for example in variable waveplates, choppers and displays. In such devices, an applied AC or DC voltage changes the orientation of the rod-shaped molecules of the liquid crystal medium in a plane defined by the incident light polarization and direction of propagation, thus varying the index of refraction. While the scattering loss of such media may be too high for some applications in high finesse, high-contrast Fabry Perot filters requiring high reflection (R~95%) mirrors, the frequency selective element of this example has low finesse and low contrast and only requires relatively low reflectivity mirrors. We have found that some loss due to scattering in the spacer medium is acceptable. The use of such liquid crystal media in step tunable external cavity semiconductor lasers is novel. While current nematic liquid crystal materials require milliseconds to change index of refraction, smectic-C materials are known that change orientation (i.e. index of refraction) in a few microseconds, thus adequate switching speed is obtainable. Alternatively, one can make use of the Vernier effect in which the modes of a thick etalon are spaced somewhat differently from a multiple of the spacing of the modes of the overall cavity, but lasing occurs only on the cavity mode most nearly centered on an etalon peak. The thickness of such an etalon may be greater than stated above, with a corresponding reduction in the necessary applied voltage.

In a further embodiment the etalon 31 contains air ($n_o$~1) between the conducting mirror surfaces, rather than a solid or liquid medium. Air-spaced etalons with dielectric mirrors deposited on thick transparent substrates are known, but previous embodiments have had fixed spacing between the mirrors or have been actuated by piezoelectric transducers. Such etalons cannot switch frequencies rapidly enough (e.g. <1 millisecond) for use in telecommunication applications. In a preferred embodiment of the present invention, the mirrors are free-standing semiconductor film stacks supported on flexure mounts and fabricated by deposition and etching in a planar MEMS (microelectro-mechanical systems) process. A voltage difference applied to the mirrors causes them to attract one another, changing the spacing between them, thereby varying the peak transmission frequency of the frequency selective element 31. Individual high reflectivity free-standing films with flexure support have been fabricated as laser mirrors for VCSELs. However, the use of such films in an intra-cavity etalon of a STECAM is novel.

Figure 16:
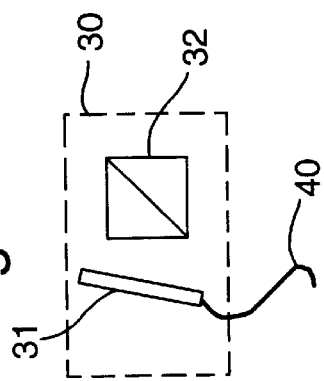
FIG. 16 is another embodiment of an electronically adjustable tuning element which incorporates a Brewster-angled window as a polarization selective element and a birefringent electro-optical medium to select the desired lasing mode.

FIG. 16 illustrates yet another embodiment of the intra-cavity mode selector 30, wherein an electro-optically tunable Lyot filter determines the oscillating mode. In this embodiment, the polarization selective component is a Brewster-angle window 33 which transmits essentially 100% of light linearly polarized in the plane of the page, but less of the light polarized in the perpendicular plane. The Lyot filter comprises a birefringent crystal 35 with ordinary 36 and extraordinary 34 axes oriented at ±45° to the high transmission direction of the polarization selecting element 33. Electrodes are deposited on the transverse faces of the crystal so that an electric field can be created within the crystal along the extra-ordinary axis 34 by applying a voltage V to the attached wires 40. Such an applied voltage modifies the indices of refraction of the crystal approximately according to:

$$n_o(V) = n_o - n_o^3 r_{13} V/2t \text{ and } n_e(V) = n_e - n_e^3 r_{33} V/2t$$

where t is the thickness of the crystal along the axis 34 (between the electrodes). More generally, the voltage may be applied along any crystal axis which exhibits electro-optic activity (i.e. an axis with non-zero electro-optic coefficient). The crystal 35 with length d along the light propagation axis acts as a high-order wave plate with retardation (in waves) of, $$N(V) = [n_e(V) - n_o(V)] d/\lambda$$

When $N(V) < \lambda_o(2\Delta\lambda_G)$, there is only one transmission maximum for light of wavelength within the gain bandwidth making a full round-trip through the filter. This defines the maximum crystal length d in this embodiment. Those skilled in the art will recognize that the faces of crystal 35 are necessarily substantially perpendicular to the propagation direction of the light in the cavity and require anti-reflection coating to prevent their affecting the cavity resonances. Coatings with reflectivities <0.1% are known in the art.

Figure 17:
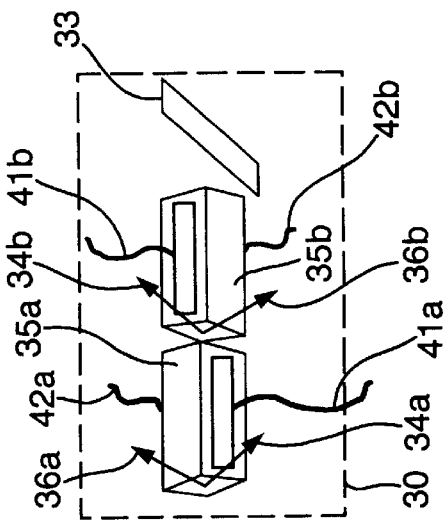
FIG. 17 illustrates the effect of a tilted birefringent tuning element upon the polarization of the light in the laser cavity.

FIG. 17 illustrates the polarization of light in a plane perpendicular to the cavity axis in FIGS. 11 and 14 when using the Lyot filter in FIG. 16. In FIG. 17, the high transmission direction of the polarization selective element 33 of FIG. 16 is labeled "H" and shown as item 33a. The orthogonal low transmission axis is shown as "L" and 33b. Light of the high transmission polarization "H" having propagated from right to left through 33 in FIG. 16 encounters crystal 35. The light of the "H" polarization is resolved into components on "e" the extra-ordinary (34) and "o" on the ordinary axis (36) of crystal 35. In propagating through the crystal, these two polarization components accumulate a phase-shift with respect to one another. Light propagating out of the crystal to the left then encounters the amplifying mirror of the laser cavity (20 in FIGS. 11 and 14), which does not alter the accumulated phase shift, but reflects the light back through the crystal 35 from left to right. A unique property of the VECSEL amplifying mirror (unlike edge emitter mirrors) is that it does not significantly affect the polarization of the amplified beam. In an ECSAL the gain medium can also be polarization insensitive. The net effect is that the two polarizations of light with wavelength $\lambda$ accumulate a phase shift of 2N(V) (in waves) with respect to one another as the result of a round trip through crystal 35. If 2N(V) is an integer, the light is returned to the polarization selective element in the polarization "H" with which it began. This condition represents the maximum transmission of the filter and the axial mode with the wavelength $\lambda$ that corresponds most closely to it will be the mode that would be caused to lase. In general 2N(V) will not be an integer and the light will return to polarization selector 33 in an elliptical state of polarization shown graphically as 39 in FIG. 17. Such a polarization is not transmitted without loss through the polarizer 33 in FIG. 16. Additional loss occurs when that light is reflected by cavity mirror 25 in FIGS. 1 and 4 back through polarizer 33. When the voltage V is changed rapidly to V', the selected wavelength $\lambda$ also changes rapidly. The oscillating mode (73 in FIG. 2) is extinguished and the sub-threshold mode with wavelength $\lambda'$ that makes 2N(V') most nearly integral begins to build up.

Figure 18:
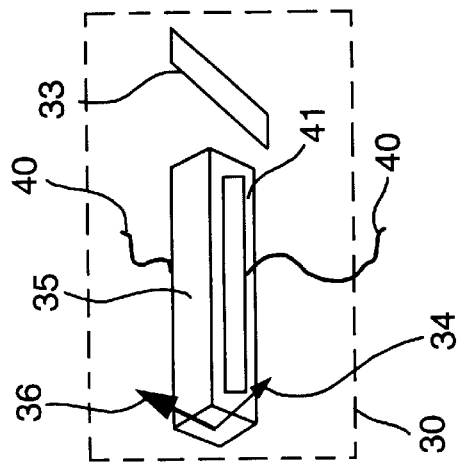
FIG. 18 illustrates another embodiment of an electronically adjustable tuning element in which there are a plurality of electro-optically active birefringent media.

FIG. 18 illustrates another embodiment of the mode-selective element 30 wherein the birefringent electro-optical media are constituted as two crystals (35a & 35b). In the embodiment shown, the extraordinary axis of one crystal (34a) is parallel to the ordinary axis of the other crystal (36b) and vice versa (34b & 36a). The net effect of having these crystals rotated by 90° with respect to one another is that the birefringences of the two crystals act in opposition, producing a net phase shift for round trip light of: $2N_x(V_a, V_b) = 2\{[n_e(V_a) - n_o(V_a)]d_a/\lambda - [n_e(V_b) - n_o(V_b)]d_b/\lambda\}$. where $d_a$ and $d_b$ are the axial lengths of crystals 35a and 35b, respectively, and $V_a$ and $V_b$ are the voltages applied between electrodes on opposing faces perpendicular to the extraordinary axes on crystals 35a and 35b, respectively. Said voltages are applied by means of wires 41a and 41b attached to the +electro-optic faces of the two crystals and wires 42a and 42b attached to the −electro-optic faces. Because of the cancellation in the phase shifts produced by the two crystals, considerably longer crystal lengths $d_a$ and $d_b$ or larger birefringences $n_e - n_o$ can be employed in this design without violating the "single transmission maximum" condition: $N_x(V_a, V_b) < \lambda_o/(2\Delta\lambda_G)$. When $V = V_a = -V_b$ the electro-optic phase variations of the two crystals add, even though the static birefringences subtract. Such a voltage arrangement can be obtained by connecting wires 41a and 42b to one side of the electro-optic driver circuit producing mode-selection voltage V while connecting 41b and 42a to the other side. Changing V to $V^1$ then has the same effect on the modes of oscillation as in the implementation illustrated and described for FIG. 16. In particular the voltage-induced polarization changes illustrated in FIG. 17 again apply. One skilled in the art will recognize that the two crystals in FIG. 18 will require an anti-reflection coating to prevent their faces, which are substantially perpendicular to the light propagation direction, from altering the performance of the resonator. Reflections from the surfaces between crystal 35a and 35b in FIG. 18 can be suppressed using an index matching material or by optical contacting using methods known to those skilled in the art.

FIG. 19 illustrates another embodiment of the mode-selective element 30 of the present invention in which a birefringent optical element (37) without electro-optic function is utilized. In this embodiment, the birefringent element 37 is a zero-order half wave plate with extra-ordinary axis 38 oriented at 45° to the crystal axes. Such a device allows the ordinary axes (36) of the two crystals to be oriented parallel to one another at ±45° to the high-transmission axis of 33 and the extra-ordinary axes (34) to be oriented either parallel or anti-parallel to one another. In the illustrated case, the relative phase shifts due to the static birefringences of the two electro-optic crystals subtract as in the previous case (FIG. 18) and proper connection of the leads attached to the electrodes on the electro-optic crystals allows the voltage-dependent phase shifts (and thus the tuning effects of the two crystals) to add. Adding non-electro-optic birefringent elements to the electrically controllable Lyot filter as illustrated in FIG. 19 can improve performance by, for example, broadening the angular acceptance of element 30 and reducing the required assembly precision. Those skilled in the art will recognize that other functionally equivalent layouts to those illustrated are possible.

FIG. 20 illustrates the effect of the half wave plate 37 in FIG. 19 with extra-ordinary axis 38 and ordinary axis 39. The half wave plate has the effect of reflecting an arbitrary polarization 43 in one crystal through the plane defined by the extra-ordinary axis 38 and the propagation direction (out of the plane of the paper in FIG. 20) leading to an output polarization 44 which propagates into the second crystal. If the axes 38 and 39 of the waveplate 37 are oriented at approximately 45° to the axes 34 and 36 of the crystals 35a and 35b, then the projections of the arbitrary initial polarization 43 on the ordinary axis 36 and the extra-ordinary axis 34 of one crystal are exchanged by the wave-plate induced transformation of polarization 43 into 44. Thus the projection of 43 on the ordinary axis 36 in the first crystal becomes the projection of 44 on the extra-ordinary axis 34 in the second crystal. Thus even though the axes of the two crystals in FIG. 9 are parallel, the polarizations behave as they do in FIG. 8 where the crystals are rotated 90° with respect to one another and the previous formula for $N_x(V)$ applies.

In a further implementation, the bulk of the Lyot filter action of the mode selective element may be supplied by a uniaxial material without electro-optic properties while a variable waveplate with a range of 0–1 waves of retardation provides the tuning. In such a device one crystal in FIG. 18 (e.g. 35a) would be made of calcite or a similar uniaxial substance, but would lack wires and electrodes (41a and 42a) and would have length d sufficient to give rise to a phase shift (in waves) between light polarized along the ordinary and extraordinary axes of $N_a=(n_{e-no})d/\lambda_{min}<\lambda_{min}/(2\Delta\lambda_G)$. where $\lambda_{min}$ is the minimum wavelength of the desired tuning band. The second crystal modulator would be replaced by a thin variable waveplate having a variable retardance $0<N_b(V)<1$ and oriented to add its retardance to $N_a$. Alternatively $N_a$ may be any N wherein $\lambda$ in the above quotation is any $\lambda$ within the desired tuning range. Under the circumstances $N_b$ must span a range of 1 which includes the value 0 but the range need not be symmetrical around 0. The total retardance of the combination would be $N_t(V)=N_a+N_b$ (V)<$\lambda_{min}/(2\Delta\lambda_G)$, thereby assuring a single value transmission peak as previously described. At $V_{min}$ the retardance $N_t(V_{min})$ is a half integer for the minimum wavelength $\lambda_{min}$. Increasing the retardance of the electro-optic modulator by increasing the voltage then requires an increased value of $\lambda$ to maintain a half intregal value of $N_t(V)=(n_e-n_o)d/\lambda+N_b$ (V), thus tuning the transmission maximum. Suitable variable waveplates are known and have been fabricated using liquid crystal media with longitudinal AC and DC electric fields applied through transparent electrodes. Such a system can be compact and have a larger aperture than the previously described electro-optic wave plate. While most variable waveplates currently sold are generally too slow for sub-millisecond wavelength switching, improved media e.g. smectic-C liquid crystals, produce analog switching times below 1 millisecond.

Given that the electro-optic materials and coating technologies are not perfect, it is desirable to minimize the amplitude of the applied voltage integrated over time, in order to avoid possibly damaging either the electro-optic material or coating. Since the birefringence of electro-optic crystals can be tuned with temperature as well as with voltage, once the electro-optic element is switched quickly (i.e. <1 millisecond) to a desired wavelength by changing the applied voltage, then the temperature of the crystal can be adjusted so that the desired wavelength requires zero applied voltage. The temperature will change slowly (>>1 millisecond), and the applied voltage should be reduced gradually as the temperature changes so that the tuning wavelength of the filter remains unchanged during this process. Switching quickly to a new desired wavelength at any time during the temperature change, or after, is still possible by a change in the applied voltage, where the change in the voltage corresponds to the change in wavelength. After each switch of the wavelength, the temperature should be adjusted toward a new target corresponding to the current desired wavelength.

The voltage requirements of the crystals 35 in FIGS. 16, 18 & 19 in which the voltage is applied transversely across the crystals can be reduced by reducing the separation between the electrodes connected to the leads 40 & 41, necessarily reducing the clear aperture of the device 30. In order to reduce loss due to scattering of light by the edges of the crystal, it may be desirable to create a secondary beam waist within or near the crystals 35. The first beam waist is inherently formed within the VECSEL cavity.

FIG. 21 illustrates an embodiment of this invention in which an anti-reflective coated lens 61 has been added to the mode selective element 30 within the cavity formed by the amplifying mirror 20 and the outer mirror 25. Said lens 61 does not otherwise alter the behavior of the device, merely facilitating lower cavity loss. FIG. 22 shows another implementation in which the secondary beam waist, which minimizes the cavity beam within the electro-optic crystal 35, has been created by a mirror 62. Since the light incident on the mirror is reflected at an angle, the dielectric coatings of this mirror can be designed to have less reflectivity for one polarization than the other. Thus mirror 62 can combine the roles of providing a secondary beam waist and a polarization selective element (33 in FIG. 21). In a preferred implementation, the reflecting surface of mirror 62 has the figure of an off-axis paraboloid or ellipsoid, thus minimizing wavefront distortions for the TEM zero/zero transverse mode of the cavity formed by mirrors 20, 62 and 25. Although mirror 25 is illustrated in FIGS. 21 and 22 as being concave it may be alternatively be of planar configuration in which case the second beam waist is at the nearby mirror 25 rather than within the crystal 35.

Amplifying mirrors of the sort illustrated in FIG. 13 can also have polarization dependence. In a further implementation of this invention the roles of the polarization selecting element 33 in FIG. 14 and the amplifying mirror 20 can be combined in a single element. Alternatively, the polarization dependent gain of the amplifying mirror 20 can act as a second polarization-selective element in a cavity containing a mode selector 30 with its own polarization selector (32 in FIG. 15, for example). A cavity with multiple polarization selective elements requires care in aligning polarization axes to provide minimum loss and adequate tuning.

Those skilled in the art will recognize that the specific geometries described heretofore are for purposes of illustration only and substantially the same principles apply for different configurations. In particular, the extra-ordinary axis of a uniaxial electro-optic crystal need not be oriented perpendicularly with respect to both the ordinary axis and propagation direction in order for the mode selective device to have the rapid electro-optic switching behavior described. In some implementations, it may be sufficient that the extra-ordinary axis lie at some angle in a plane orthogonal to the ordinary axis, with that plane also containing the axis of propagation. Additionally, electrical fields may be applied in different directions to switch the electro-optic media according to this invention. Frequency selective elements combining reflection (as in the etalon case of FIG. 15) and Lyot filter action (as in FIG. 16) are also useful implementations of the present invention.

The present invention has been described and depicted herein with reference to preferred and other embodiments. The present invention is not restricted, however, to those embodiments. Rather the invention is limited only by the claims appended hereto.

Those skilled in the art will appreciate that many changes and modifications will become readily apparent from consideration of the foregoing descriptions of preferred embodiments without departure from the spirit of the present invention, the scope there of being more particularly pointed out by the following claims. The descriptions herein and the disclosures hereof are by way of illustration only and should not be construed as limiting the scope of the present invention.

What is claimed is:

1. A stepwise tunable external cavity laser, comprising an optical resonator, the resonator comprising:
   a semiconductor amplifying mirror having a selected gain wavelength band and forming a first end of an optical resonator;
   an external mirror forming a second end of the optical resonator, the external mirror being positioned such that a frequency comb of the optical resonator provides is aligned to a predetermined optical channel spacing arrangement; and
   an electronically-actuated, frequency selective element, positioned within the optical resonator and having a control input to select an emission wavelength, of an optical beam emitted by the laser.

2. The laser of claim 1, wherein said amplifying mirror comprises an epitaxially grown monolithic semiconductor structure having a surface emitting gain region, the gain region including a plurality of active layers spaced apart by spacer layers, arranged to provide optical gain, and overlying a region of said amplifying mirror, the semiconductor structure comprising at least first and second layers of materials having different indices of refraction and selected to provide reflectivity greater than 95 percent over said gain wavelength band.

3. The laser of claim 1, wherein said amplifying mirror is excited to produce gain by radiation focused onto a selected region of said amplifying mirror.

4. The laser of claim 1, wherein said amplifying mirror is excited to produce gain by an electrical current.

5. The laser of claim 1, wherein said amplifying mirror is attached to a heat sink means that allows control of a temperature of said amplifying mirror.

6. The laser of claim 1, wherein said external mirror has a concave surface, with a radius of curvature that maintains a single transverse mode of oscillation over a selected range of optical pumping power, the concave surface being coated with at least first and second layers of dielectric materials having different indices of refraction and being selected to provide a reflectivity greater than 95 percent over said gain wavelength band.

7. The laser of claim 1, wherein said external mirror is planar, said laser further comprising a focusing element positioned within said optical resonator so that said optical resonator is centered within a selected resonator stability range.

8. The laser of claim 1, wherein said optical resonator further comprises at least one optical element, positioned between said amplifying mirror and said frequency selective element, to reduce angular divergence of an optical beam as the optical beam enters said frequency selective element.

9. The laser of claim 8, wherein said optical element comprises a lens.

10. The laser of claim 8, wherein said optical element comprises a concave mirror with a multi-layer dielectric coating.

11. The laser of claim 8, wherein said optical element comprises an off-axis parabolic mirror.

12. The laser of claim 1, wherein said frequency selective element comprises an intra-cavity etalon having an electronically-actuated control means to alter an angle between a normal to an etalon surface and a direction of propagation of an intra-cavity laser beam, whereby an emission wavelength of said laser is tunable.

13. The laser of claim 1, wherein said frequency selective element comprises a monolithic planar, air-spaced etalon comprising a free-standing dielectric film mirror, wherein a frequency of maximum transmission of the etalon is tunable by application of a variable voltage to the etalon.

14. The laser of claim 1, wherein said frequency selective element comprises a planar etalon, including a spacer medium comprising an electro-optically active material, wherein a frequency of maximum transmission of the etalon is tunable by application of a variable voltage to the spacer medium.

15. The laser of claim 14, wherein said spacer medium comprises a nematic or smectic liquid crystal.

16. The laser of claim 1, wherein said frequency selective element comprises:
   a polarization selective element having a high transmission axis;
   a birefringent electro-optical medium with an ordinary axis and an extraordinary axis oriented at substantially +45° and at −45° respectively, with respect to the high transmission axis of the polarization selective element; and
   voltage means for applying a selected voltage to the electro-optical medium, and for varying the selected voltage over a range of values that includes said gain wavelength band.

17. The laser of claim 1, wherein said frequency selective element comprises:

a polarization selective element having a high transmission axis;

a first birefringent electro-optical medium with an ordinary axis and an extraordinary axis oriented at substantially +45° and −45°, respectively, with respect to the high transmission axis of the polarization selective element;

a second birefringent electro-optical medium with an ordinary axis and an extraordinary axis oriented so that the extraordinary axis of the second electro-optic medium is substantially aligned with the ordinary axis of the first electro-optic medium, and the ordinary axis of the second electro-optic medium is substantially aligned with the extraordinary axis of the first electro-optic medium; and voltage means for applying a first selected voltage to the first electro-optical medium, for applying a second selected voltage to the second electro-optical medium, and for varying at least one of the first and second selected voltages over a range of values that includes said gain wavelength band, whereby a total length of electro-optic media in said laser can be increased without reducing a laser tuning range, thereby allowing use of at least one of a reduced first selected voltage and a reduced second selected voltage.

18. The laser of claim 1, wherein said frequency selective element comprises:

a polarization selective element having a high transmission axis;

a first birefringent electro-optical medium with an ordinary axis and an extraordinary axis oriented at substantially +45° and at −45°, respectively, with respect to the high transmission axis of the polarization selective element;

a second birefringent electro-optical medium with an ordinary axis and an extraordinary axis oriented such that the extraordinary axis of the second electro-optic medium is substantially aligned with the extraordinary axis of the first electro-optic medium, and the ordinary axis of the second electro-optic medium is substantially aligned with the ordinary axis of the first electro-optic medium;

a half-wave plate, positioned between the first electro-optic medium and the second electro-optic medium, oriented such that light polarized along an ordinary axis of the first electro-optical medium is substantially converted to light polarized along an extraordinary axis of the second electro-optical medium, and light polarized along an extraordinary axis of the first electro-optical medium is substantially converted to light polarized along an ordinary axis of the second electro-optical medium, in transmission through the half wave plate; and voltage means for applying a first selected voltage to the first electro-optical medium and for applying a second selected voltage to the second electro-optical medium, and for varying at least one of the first and second selected voltages over a range of values that includes said gain wavelength band, whereby an angular bandwidth of said frequency selective element is enhanced, and a total length of the electro-optic media in said laser can be increased without reducing a laser tuning range, thereby allowing use of at least one of a reduced first selected voltage and a reduced second selected voltage.

19. The laser of claim 1, wherein said frequency selective element comprises:

a polarization selective element having a high transmission axis;

a birefringent medium with an ordinary axis and an extraordinary axis oriented at substantially +45° and −45°, respectively, with respect to the high transmission axis of the selective element;

a birefringent electro-optical medium with an ordinary axis and an extraordinary axis oriented at substantially −45° and +45°, respectively, with respect to a high transmission axis of the polyarization selective element; and voltage means for applying a selected voltage to said electro-optical medium and for varying the selected voltage over a range of values that includes said gain wavelength band.

20. The laser of claim 19, wherein said electro-optic medium comprises a nematic or smectic liquid crystal.

* * * * *